(12) United States Patent
Clayton

(10) Patent No.: US 6,232,659 B1
(45) Date of Patent: May 15, 2001

(54) THIN MULTICHIP MODULE

(76) Inventor: James E. Clayton, 10605 Marbury Ct., Austin, TX (US) 78726-1312

( * ) Notice: Subject to any disclaimer, the term of this patent is extended or adjusted under 35 U.S.C. 154(b) by 0 days.

(21) Appl. No.: 09/615,521

(22) Filed: Jul. 12, 2000

Related U.S. Application Data

(63) Continuation of application No. 09/075,738, filed on May 11, 1998, now Pat. No. 6,091,145, which is a continuation of application No. 08/472,532, filed on Jun. 7, 1995, now Pat. No. 5,751,553, which is a division of application No. 08/138,829, filed on Oct. 18, 1993, now Pat. No. 5,731,633, which is a continuation-in-part of application No. 07/947,293, filed on Sep. 16, 1992, now abandoned.

(51) Int. Cl.⁷ .................................................. H01L 23/34
(52) U.S. Cl. .......................... 257/724; 257/723; 257/726
(58) Field of Search ..................................... 257/724, 723, 257/726, 727; 361/749, 728; 439/91; 29/829

(56) References Cited

U.S. PATENT DOCUMENTS

| | | | |
|---|---|---|---|
| 4,709,300 | * 11/1987 | Landis ................................... | 361/398 |
| 5,397,916 | * 3/1995 | Normington .......................... | 257/686 |
| 5,600,178 | * 2/1997 | Russell ................................. | 257/690 |
| 5,714,802 | * 2/1998 | Cloud et al. ......................... | 257/726 |
| 5,963,427 | * 10/1999 | Bollesen .............................. | 361/704 |

* cited by examiner

Primary Examiner—Olik Chaudhuri
Assistant Examiner—Phat X. Cao

(74) Attorney, Agent, or Firm—Akin, Gump, Strauss, Hauer & Feld, L.L.P.

(57) ABSTRACT

An improved multichip semiconductor module compatible with existing SIMM memory sockets comprising a molded module frame and a composite semiconductor substrate subassembly received in a cavity in said frame. The composite semiconductor substrate subassembly or subassembly(s) comprises a plurality of semiconductor devices which are connected to electrical contacts on an edge of the molded frame by a variety of configurations described herein. In one embodiment of the invention, the subassembly(s) includes a composite substrate which comprises a thin metal cover plate and thin laminate circuit which is bonded to the metal cover plate by a film adhesive. The composite substrate provides a mounting surface for the placement of semiconductor devices and their associated passive components. In some of the embodiments disclosed herein, the subassembly(s), comprising a cover plate with the composite substrate attached thereto, is permanently attached to the molded frame by a rectangular ring formed from an anisotropic, electrically conductive adhesive material. In other embodiments, the subassembly(s) are removably attached to a module frame socket. The composite substrate employed in the present invention offers the advantages of allowing the components to be pre-assembled, tested and repaired prior to final attachment into the molded frame, and aids in the transfer of heat away from the semiconductor devices operating thereon. The module frame provides a protective enclosure for the multichip semiconductor devices and can be molded for compatible mating with existing SIMM sockets. Other high density contact means provide a greater interconnect capability.

1 Claim, 36 Drawing Sheets

SOJ-type SIMMs
(4 modules shown)

Thin Multichip SIMMs
(4 modules shown)

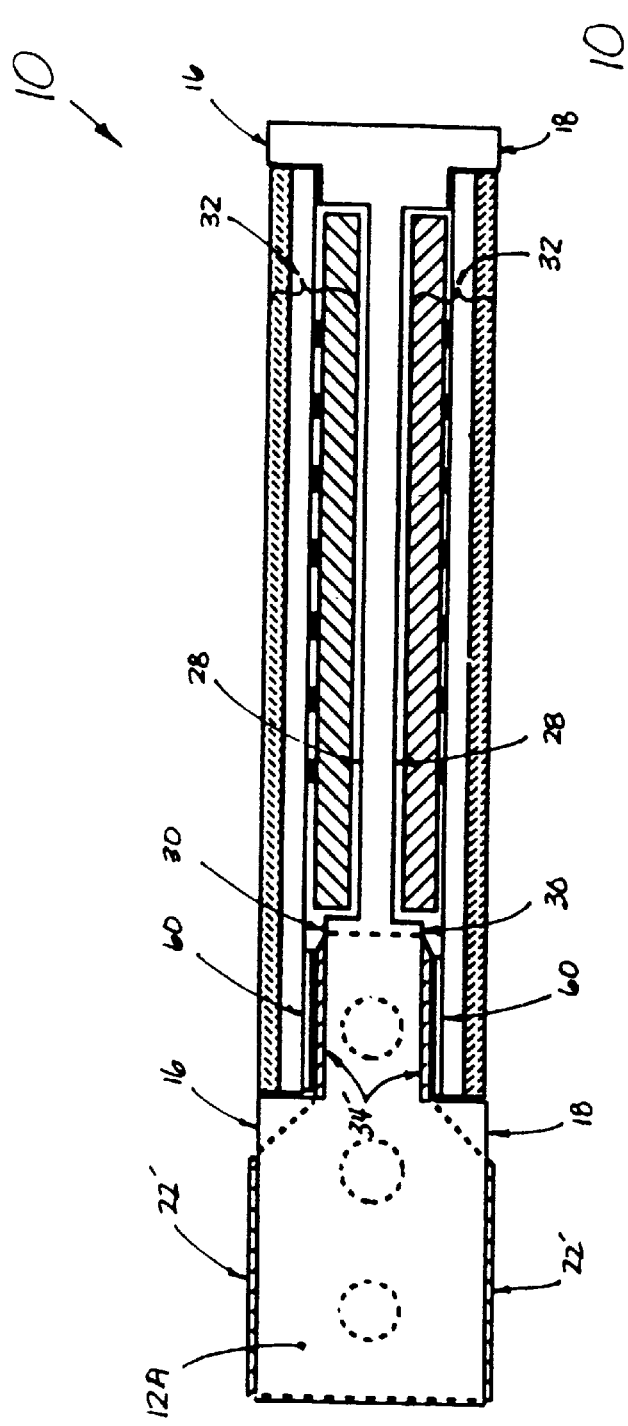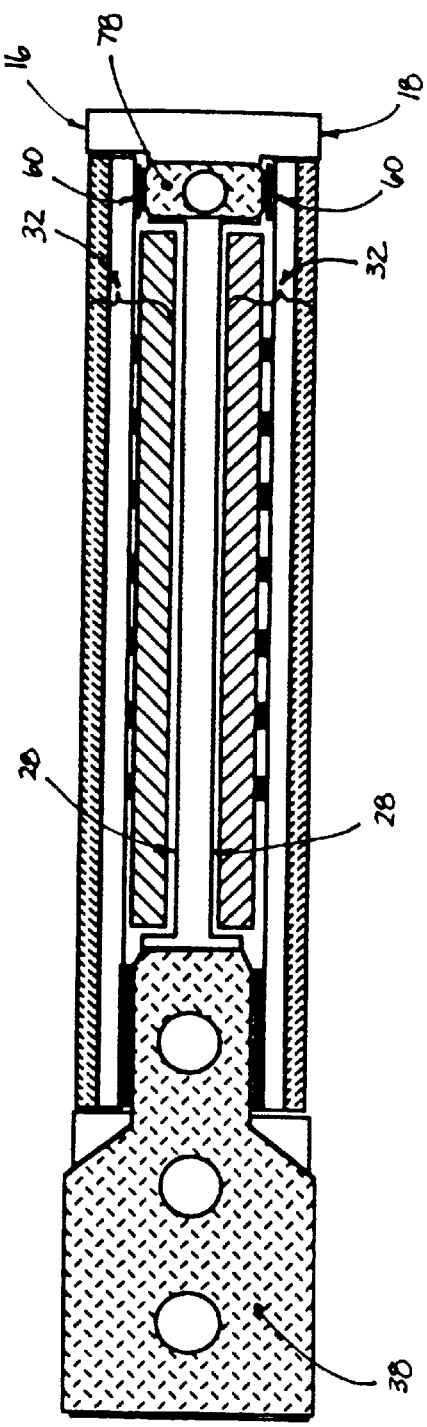
Fig. 15
Fig. 15A

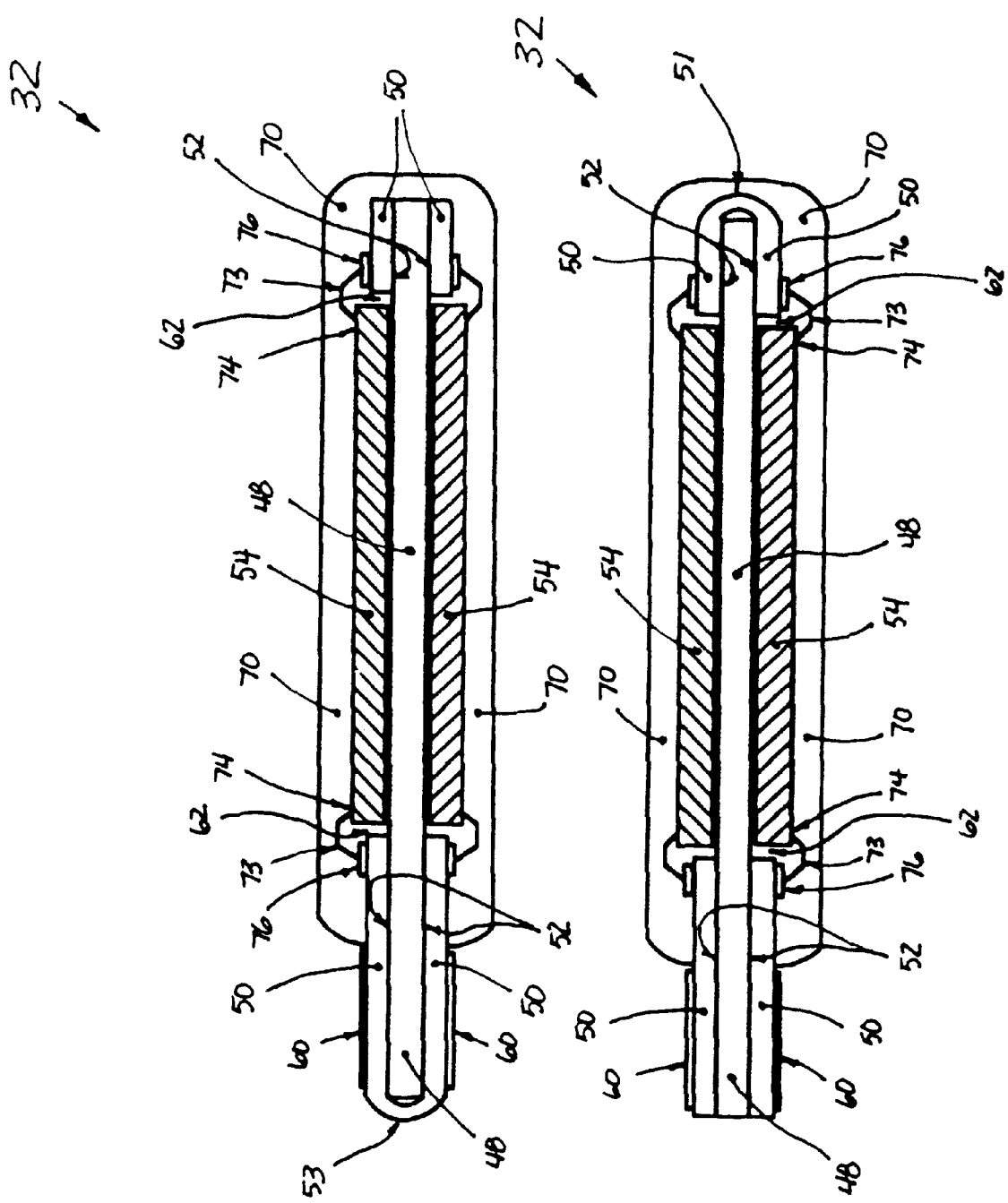

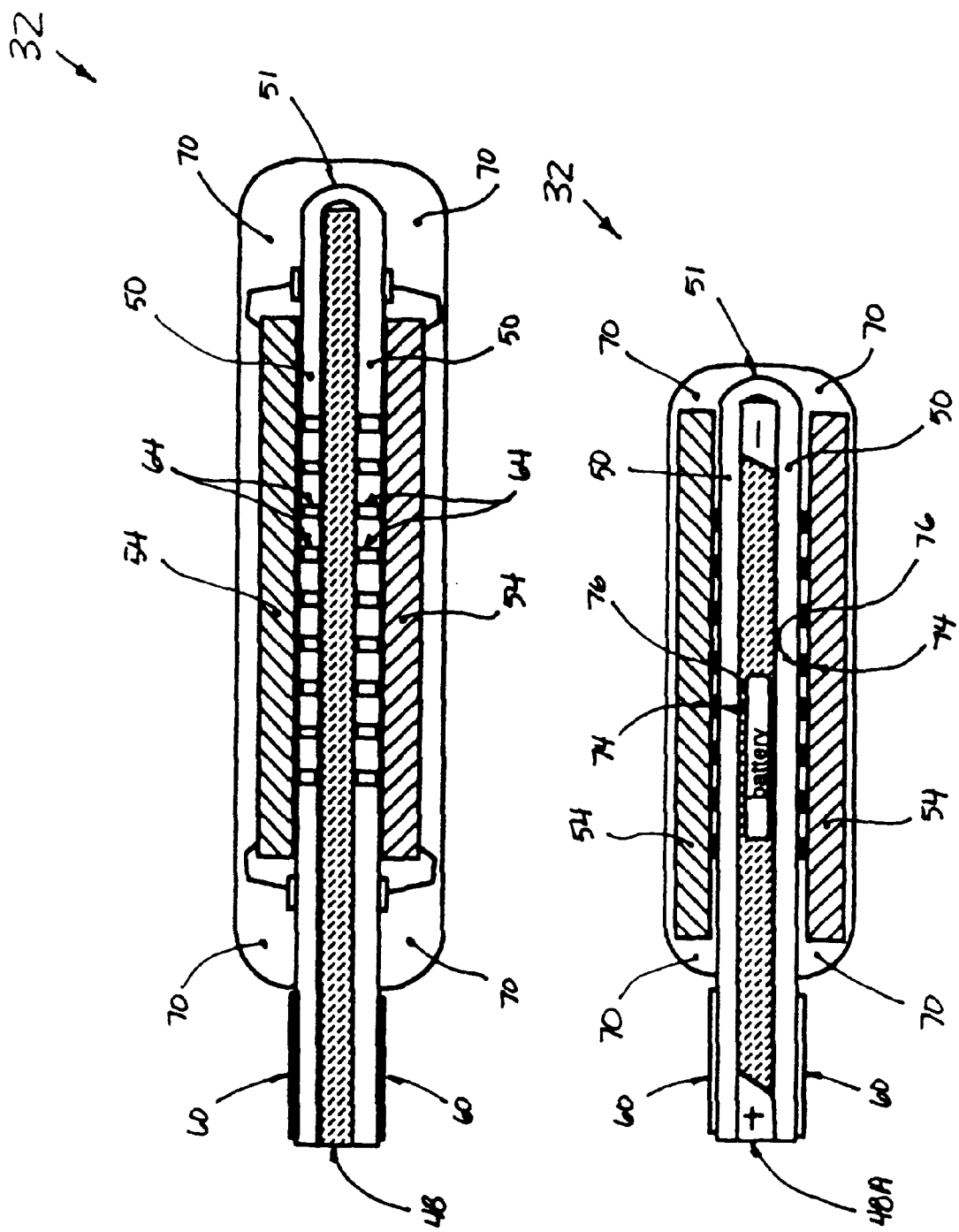

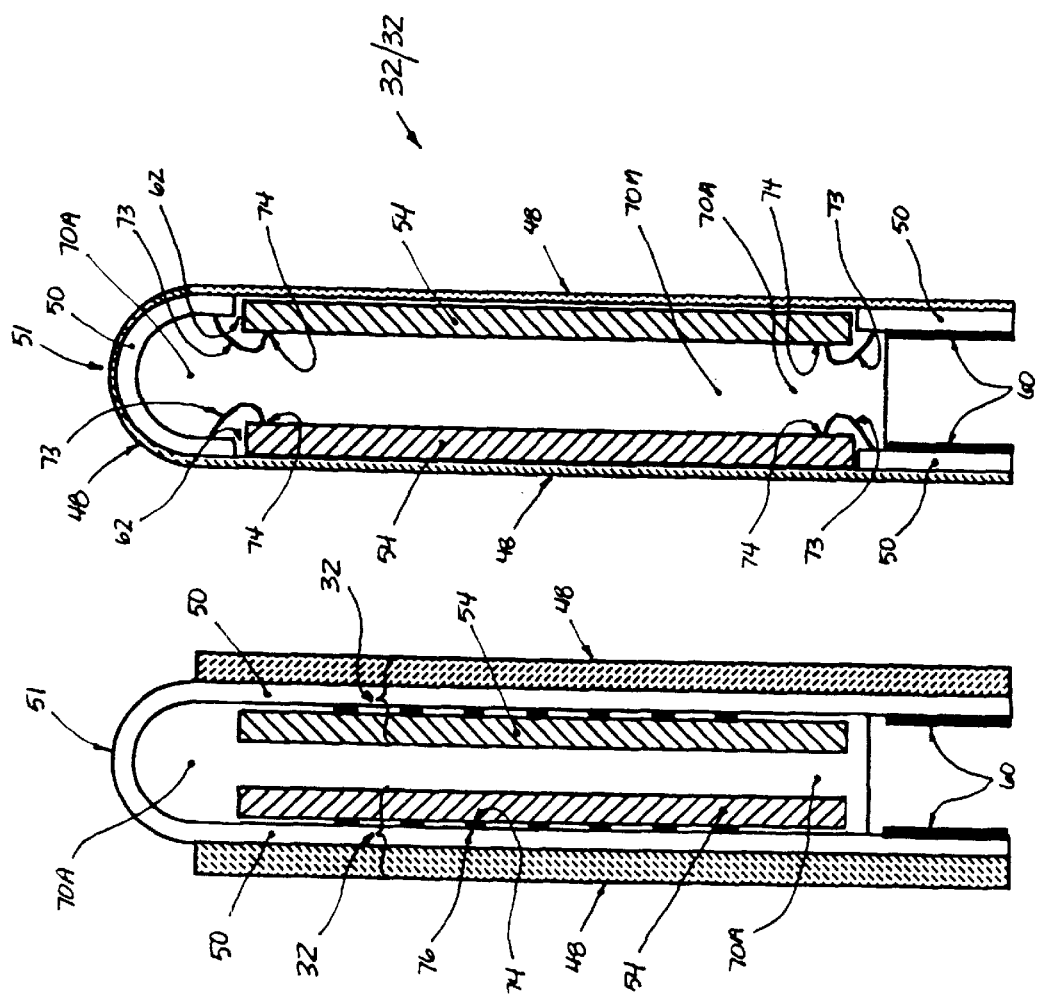

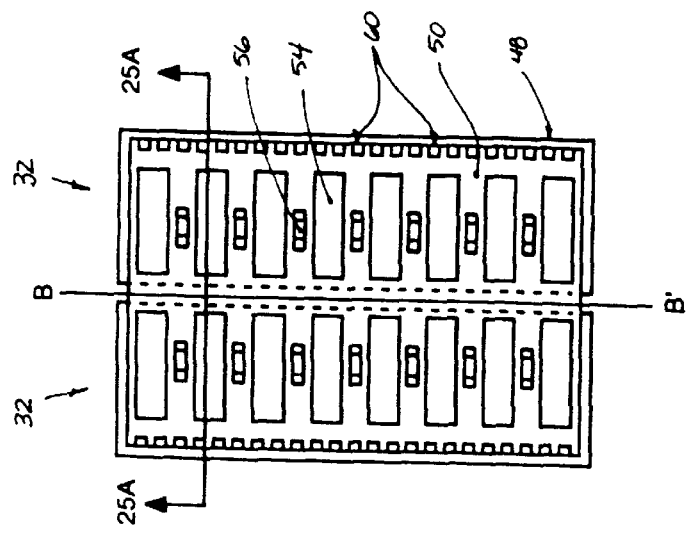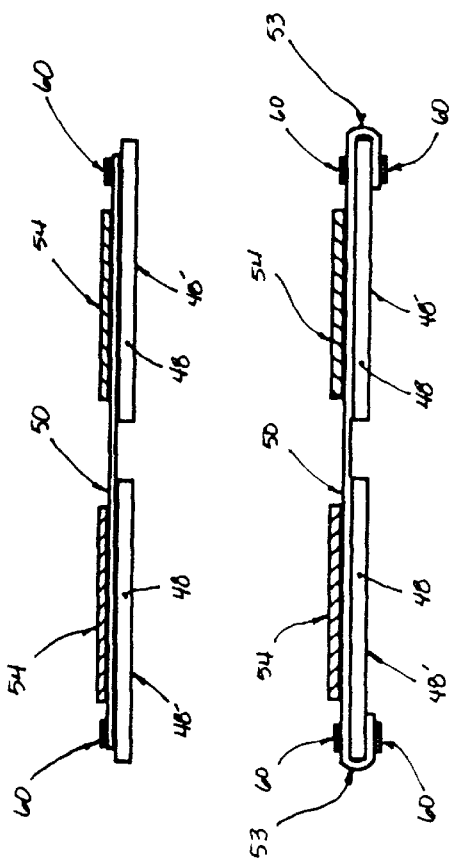
Fig. 25
Fig. 25A
Fig. 25B

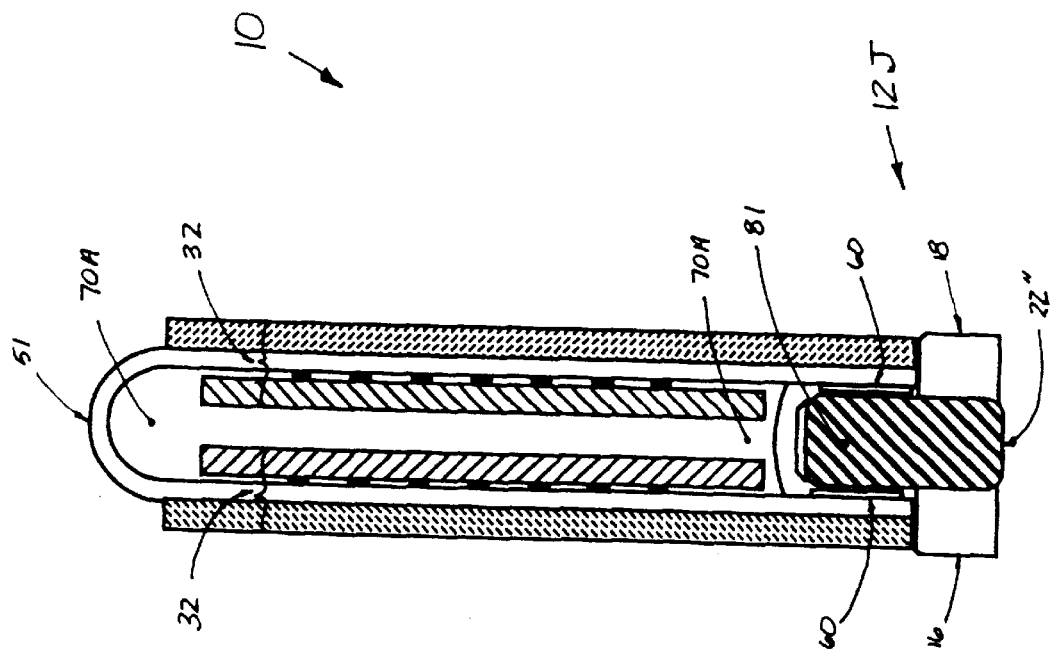
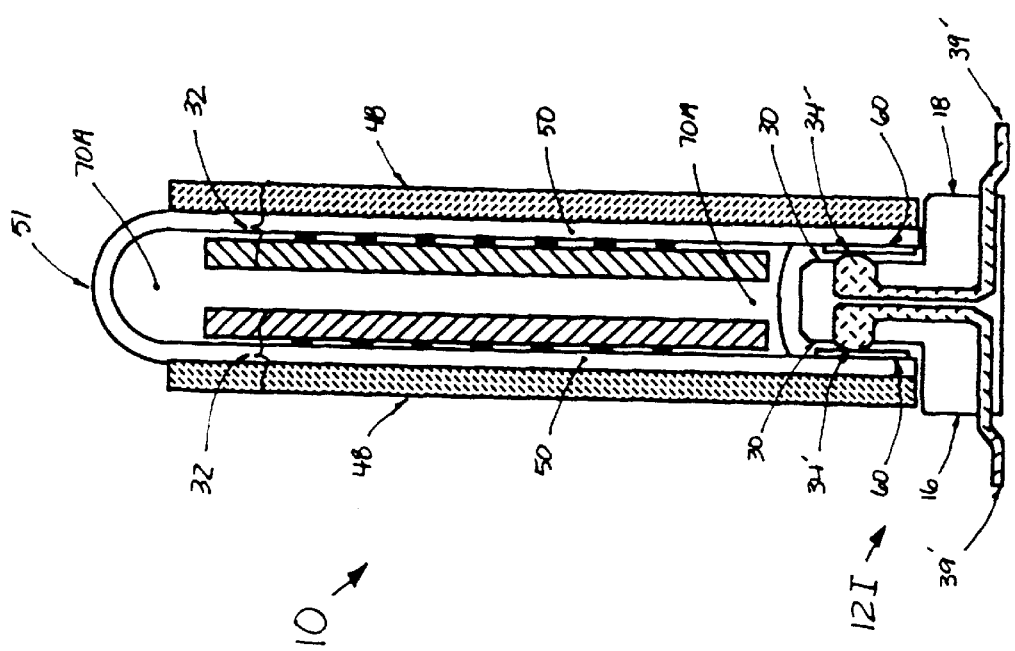
Fig. 29A
Fig. 29B

THIN MULTICHIP MODULE

RELATED APPLICATION DATA

This is a continuation of co-pending application Ser. No. 09/075,738, filed May 11, 1998 entitled "Thin Multichip Module Including A Connector Frame Socket" and issuing on Jul. 18, 2000 as U.S. Pat. No. 6,091,145, which is a continuation of application Ser. No. 08/472,532, filed Jun. 7, 1995 entitled "A Thin Multichip Module" and issuing on May 12, 1998 as U.S. Pat. No. 5,751,553, which is a divisional of. Ser. No. 08/138,829 filed Oct. 18, 1993 which is U.S. Pat. No. 5,731,633 issued Mar. 24, 1998 entitled "Thin Multichip Module"a continuation-in-part of application Ser. No. 07/947,293, filed on Sep. 16, 1992, entitled "A Thin MultiChip Module," abandoned.

FIELD OF THE INVENTION

The present invention relates generally to means for encapsulating microelectronic devices. More specifically, the present invention provides an improved module which significantly increases the packaging density of microelectronic components.

BACKGROUND

The electronics industry has a continuing goal of increasing component packaging density in an effort to obtain increased functionality and consequent performance in smaller volumetric size. The principal roadblocks in meeting this goal have been the lack of industry standards for form factors and a flexible design which can be adapted to differing device types. Another significant impediment to increased packaging density has been the lack of an efficient means for dissipation of thermal energy generated by the devices.

One of the largest microelectronic device module markets is that related to dynamic random access memories (DRAM's). Since its introduction in 1983, the Single In-Line Memory Module or SIMM, disclosed generally in U.S. Pat. No's. 4,656,605 and 4,727,513, has grown to become the preferred module configuration for the DRAM semiconductor market. Among the advantages offered by the SIMM are the following: (1) its significant packaging density increase achieved over prior chip mounting configurations, (2) the convenience for modular replacement or upgrade, and (3) availability of multiple, low-cost manufacturing sources.

A continuing industry trend towards increasing performance and smaller size, however, foreshadows the need for an even more compact module than the present SIMM is able to provide. The quest for ever faster data processing and more compact, lightweight, thin, portable, hand-held electronic products necessitates newer semiconductor packaging schemes that enable aggregate assemblages of bare silicon devices to be interconnected together and mechanically protected inside a thin, lightweight module. Because of the handling difficulty and expense associated with repairing or replacing bare silicon chip devices, there is an anticipated need for an adaptable multichip module which provides a means for increasing packaging density while maintaining minimum expense. This present invention, described in greater detail below, seeks to satisfy this need within the electronic industry.

Though semiconductor memory devices occupy the vast majority of the module market today, there is also a growing requirement to modularize other semiconductor components including, but not limited to, microprocessor, application specific integrated circuits, telecommunication and other device types. Accordingly, the present invention provides an upgrade path for a greater number of interconnect pins/pads and improves the thermal dissipation characteristics over present day microelectronic device modules.

SUMMARY OF THE INVENTION

The present invention comprises various embodiments of an improved semiconductor module that houses a considerably larger number of semiconductor devices in a given volume. The module preferably is adapted for insertion into a mating socket and is removable for replacement, repair, configuration changes, or recycling. The preferred embodiments of the semiconductor module of the present invention are also backward compatible with existing SIMM sockets. Other embodiments are compatible with other standards, such as the PCMCIA (Personal Computer Memory Card International Association).

In one embodiment of the present invention, the module is broadly comprised of a molded module frame and a composite semiconductor substrate subassembly (abbreviated: "subassembly" or "subassembly(s)" or "subassemblies") received in a cavity in the frame. The composite semiconductor substrate subassembly, or subassembly, comprises a plurality of semiconductor devices which are connected to electrical contacts on an edge of the molded module frame by a variety of configurations described herein.

In one embodiment of the invention, the subassembly includes a composite substrate which comprises a thin metal cover plate and thin laminate circuit which is bonded to the metal cover plate by a film adhesive. The composite substrate provides a mounting surface for the placement of semiconductor devices and their associated passive components. In some of the embodiments disclosed herein, the subassembly is permanently attached to the molded module frame by a rectangular ring formed from an anisotropic, electrically conductive adhesive material. In other embodiments, thin laminate circuits are applied to either side of a cover plate, and semiconductor devices are applied to the laminate circuits. A protective overcoat can be applied over the semiconductor devices, as desired. Other embodiments include folded or U-shaped laminate circuits with semiconductor devices and heat dissipating cover plates applied to respective surfaces, as desired. The various embodiments of the subassembly employed in the present invention also provides for a more efficient means for conducting thermal energy from the semiconductor devices.

BRIEF DESCRIPTION OF THE DRAWINGS

FIGS. 15 and 15A are full cross-sectional views of an embodiment for the molded module frame detailed in FIG. 6, illustrated with the subassemblies in a final assembled configuration. FIG. 15 details a cross-section view emphasizing the molded portions of the molded module frame which are positioned between the contacts;

FIG. 15A is similar to FIG. 15, but emphasizes the metal contact portion of the molded module frame and illustrates an additional interconnection at the stepped ledge or edge of the molded module frame opposite the contact. This enables a crossover electrical path between the thin laminate circuits across the stepped ledge or edge;

FIGS. 18A–18D illustrate alternate embodiments of overcoated subassemblies in which semiconductor devices and components are positioned on both sides of a metal plate or thin plate-like battery and electrically joined along the edge by a single flexible circuit folded over and around the edge;

FIG. 23 is a cross-sectional view of an alternate embodiment of FIG. 22.

FIG. 24 is a cross-sectional view of yet another alternate embodiment of FIG. 22.

FIGS. 25–25B illustrate the spatial relationship of opposing subassemblies joined by a single flexible circuit prior to being folded towards each other;

FIGS. 29–29A illustrates a perspective and cross-sectional view of a module similar to that shown in FIG. 23 being mated to a module frame socket exhibiting independent, surface-mount contacts; and FIG. 29B is a cross-sectional view of a module similar to the module shown in FIG. 29A connected to a socket employing a conductive elastomeric contact;

It is to be understood that the various drawings described herein are not shown to scale, unless specifically stated otherwise.

DETAILED DESCRIPTION OF THE VARIOUS EMBODIMENTS

Figure 1:
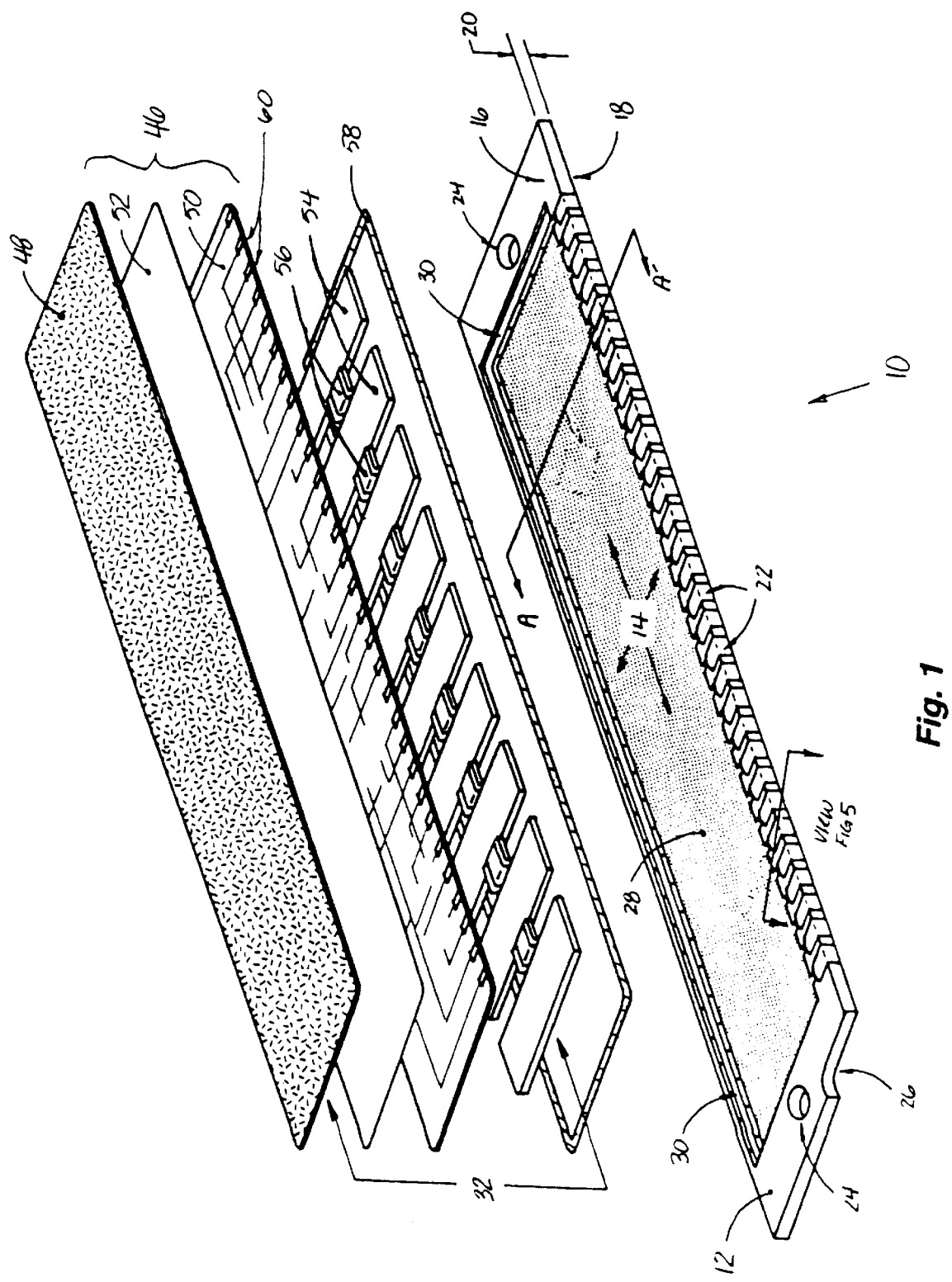
FIG. 1 is an exploded view of the major components of a first embodiment of the thin multichip module of the present invention.
Figure 1A:
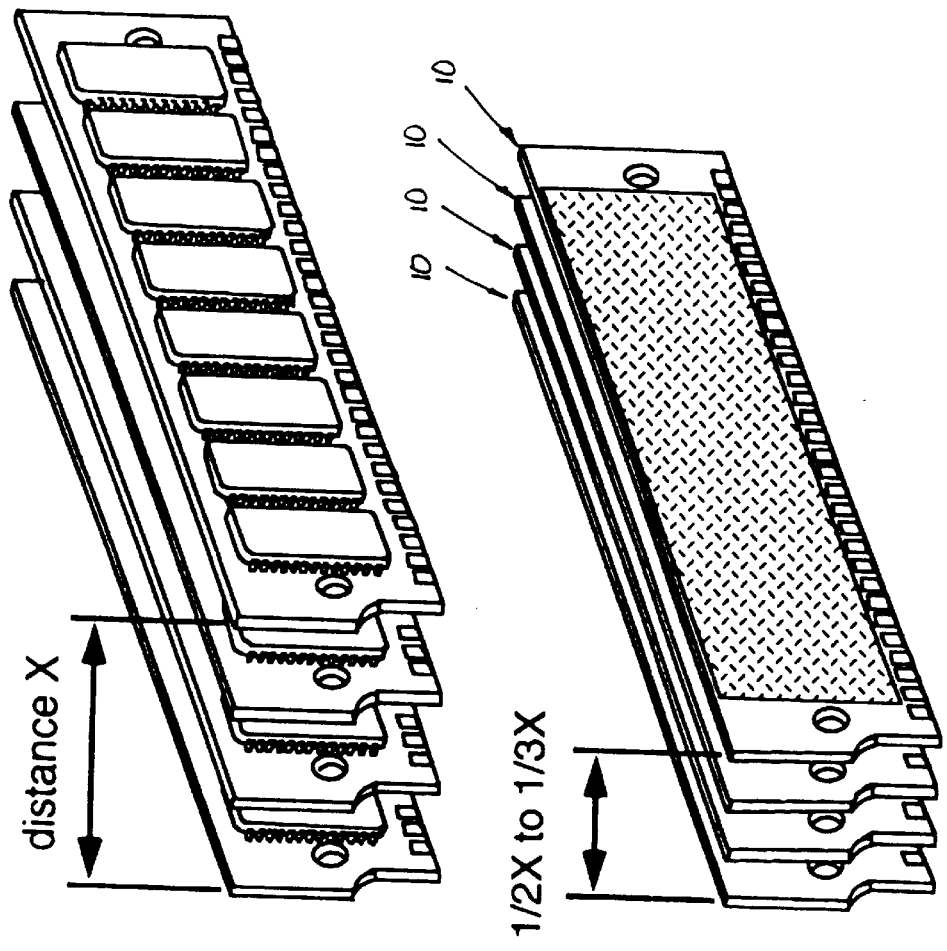
FIG. 1A illustrates the volumetric savings of the semiconductor module of the present invention as compared to standard SOJ-type SIMM modules.

The various embodiments of the multichip module 10 of the present invention can be understood by referring initially to FIG. 1, which is an exploded view of the major components of an embodiment of the module employing a molded module frame 12 and subassembly 32. As shown in FIG. 1A, this new invention enables a substantial reduction in the volumetric capacity and areal spacing between multiple adjacent vertical rows or horizontal layers of modules. Thus, a much greater number or volume of semiconductor devices can be included in a given space than that previously known in the art.

The module shown in FIG. 1 comprises a molded module frame 12 (hereinafter referred to as either "molded frame" or "module frame" or "frame") having electrical contacts 22, composite substrate 46 including cover plate 48, laminate circuit 50 and film adhesive 52, and a plurality of semiconductor device 54 mounted to the composite substrate 46. An anisotropic ring 58 is optionally used to connect the composite substrate 46 to the molded frame 12. The module 10 is preferably adapted for mating to a module socket. Other embodiments of the module of the present invention do not include a molded frame or module frame as part of the module, but are adapted for insertion into a module frame socket which essentially acts as the molded module frame for the module.

Molded Module Frame

In the embodiment of FIG. 1, the molded module frame 12 comprises an internal cavity 14 which extends over a substantial portion of the length and width of the module to provide a nesting area for electronic components in the finished module assembly. The molded module frame 12 can be manufactured from an injection molded, thermoplastic material such as a liquid crystal polymer (LCP) or "Ryton™" Both of these materials allow consistent and repeatable control over the dimensions of the molded frame 12. However, it should be obvious to one versed in the art that several other materials can be substituted without departing from the scope or spirit of this invention. For example, molded frame 12 can also be constructed from single or multiple laminate layers of epoxy glass materials—similar in composition to conventional printed circuit board (PCB) products—which have been shaped by stamping, pressing or machining processes to produce features similar in function to those described above. Alternatively, molded frame 12 can be formed from one of several ceramic based materials processed though a firing kiln or hydraulic press by techniques well known within the industry or comprised of silicon nitride or carbon-graphite material, as desired. Alternatively molded frame 12 can also be formed from an optically transparent glass or plastic to facilitate transmission of light signals between the module socket and the semiconductor devices.

The molded module frame 12 comprises first and second major parallel planes, illustrated by reference numerals 16 and 18, respectively, that are separated by a specified edge thickness, illustrated by reference numeral 20. An array of contact pads 22 along one edge of frame 12 provides electrical connection between the semiconductor devices contained within the interior of the module and an appropriate mating socket or circuit board. In the embodiment illustrated in FIG. 1, frame 12 is provided with two optional end holes 24 and a corner notch 26. These features are used for proper mating of the module to presently available SIMM sockets supplied by several connector manufacturers. In another embodiment, the module 12 is adapted to conform to the PCMCIA standard. Other embodiments, such as illustrated in FIGS. 7–9, 19, 29, and 30, can exclude these specific molded features, or can include other appendages, slots, clips or posts as described hereinbelow to assist in the final mounting of subassembly(s) 32 to the molded frame 12 or the molded frame to the main circuit board.

The internal cavity 14 can extend either partially or completely through the stepped ledge 30 and/or edge thickness 20, depending upon the spacing requirements of the components contained in the module. Various embodiments of molded floor 28 are illustrated in cross-section FIGS. 2, 3, 14–14B, 15, 15A, and 16. In cross-section FIGS. 2 and 3, which are taken along section lines A–A' of FIG. 1, the floor 28 is shown molded flush to the second major plane 18 forming a single internal cavity open on plane 16. Although it is possible to construct the frame to have a single internal cavity, it is also possible to create first and second internal cavities by forming a thin, integrally molded floor 28 positioned along the centerline of the module thickness. In the embodiments illustrated in FIGS. 14–14B, 15, 15A, and 16, for example, molded floor 28 is shown along the centerline of the module thickness to form first and second internal cavities open on planes 16 and 18 respectively. In these embodiments, the first and second internal cavities are on opposite sides of the frame 12, as shown.

Figure 14:
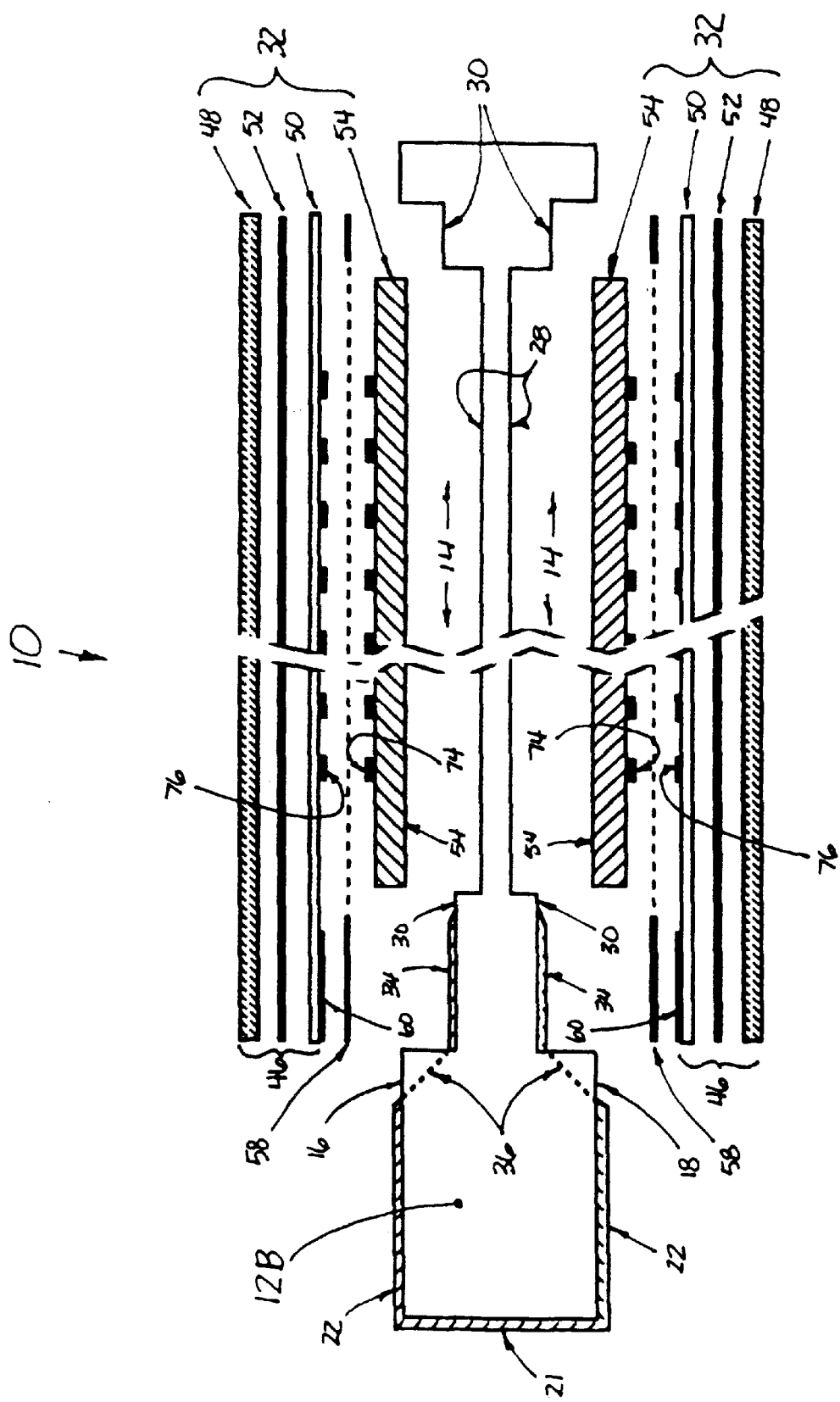
FIGS. 14, 14A and 14B are cross-sectional views of FIG. 13 detailing alternate embodiments of the molded module frame intended for assembly with multiple composite subassemblies.
Figure 14A:
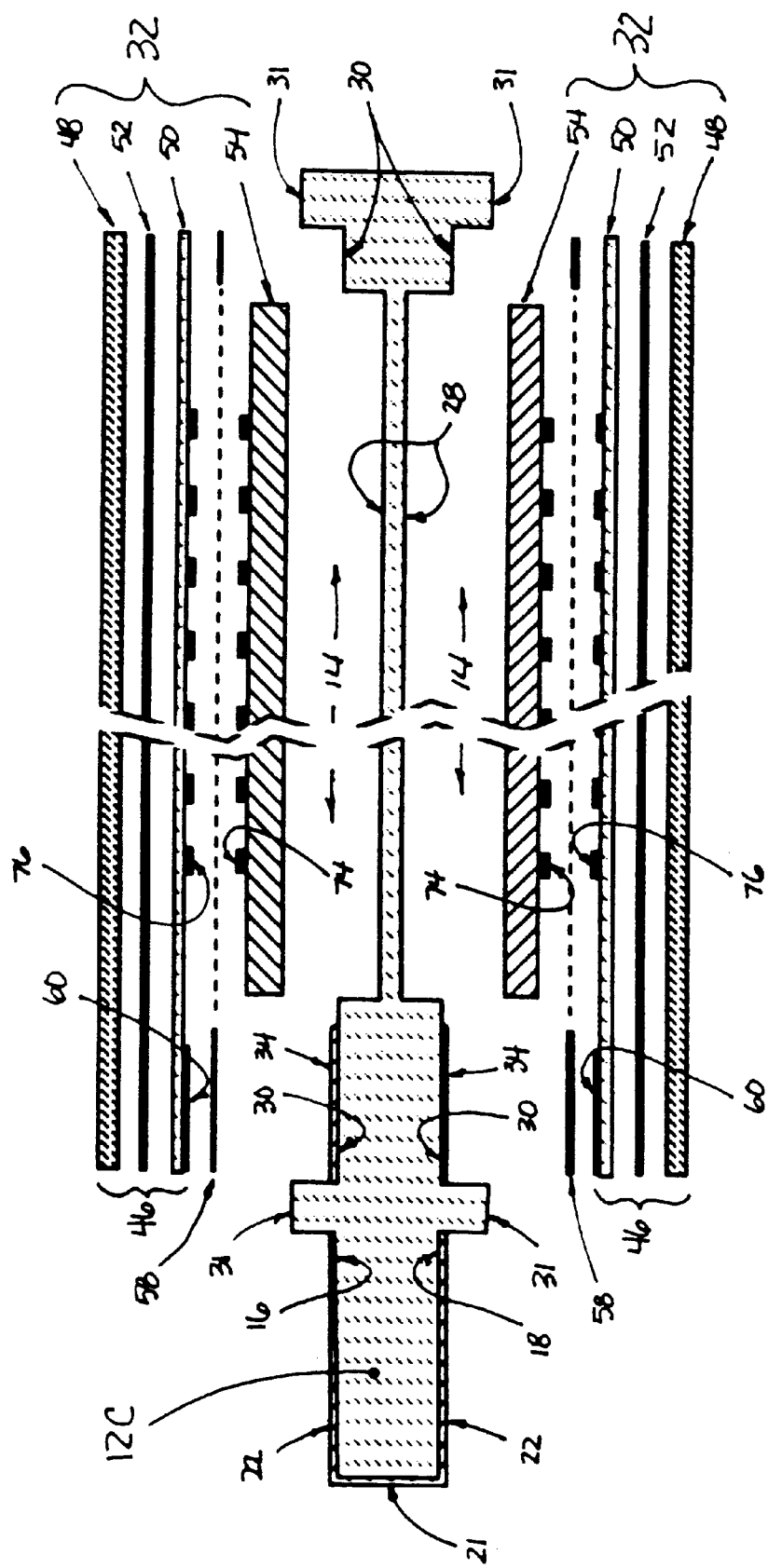

Referring again to the molded frame 12 of FIG. 1, a stepped ledge 30 is formed along the circumference of the cavity(s) 14 to provide a receiving area for mating subassembly(s) 32 described in greater detail below. In the preferred embodiment, the ledge 30 is recessed below the first major plane 16 such that after subassembly(s) 32 is positioned and sealed or fixed in place, the outer surface of subassembly 32 and major plane 16 of molded frame 12 are substantially flush to one another. In the embodiment shown in FIG. 14 having two internal cavities, the ledges 30 in each cavity are recessed below the first major plane 16 in the first cavity and the second major plane 18 in the second cavity. In some embodiments (FIG. 14B), multiple ledges can be employed. Alternatively, the ledges can be simple extensions of major plane 16 and/or major plane 18, as illustrated in FIG. 14A, placing subassembly(s) 32 further away from the center line of the module thickness, thus allowing more spacing for internal components. In this embodiment, subassemblies 32 project a short distance above major plane 16 and/or major plane 18 and are surrounded by a molded appendage or rib 31. Alternatively, in embodiments substituting a module frame socket (12E–H) in place of a molded frame 12 the ledges 30 can be substantially recessed below major plane 16 and/or major plane 18, as illustrated in FIGS. 22 and 26–28, such that these planes are situated above subassemblies 32. In the examples shown in FIGS. 22 and 26–28, molded appendages 31 also partially enclose the edges of subassemblies 32.

Contacts

Figure 2:
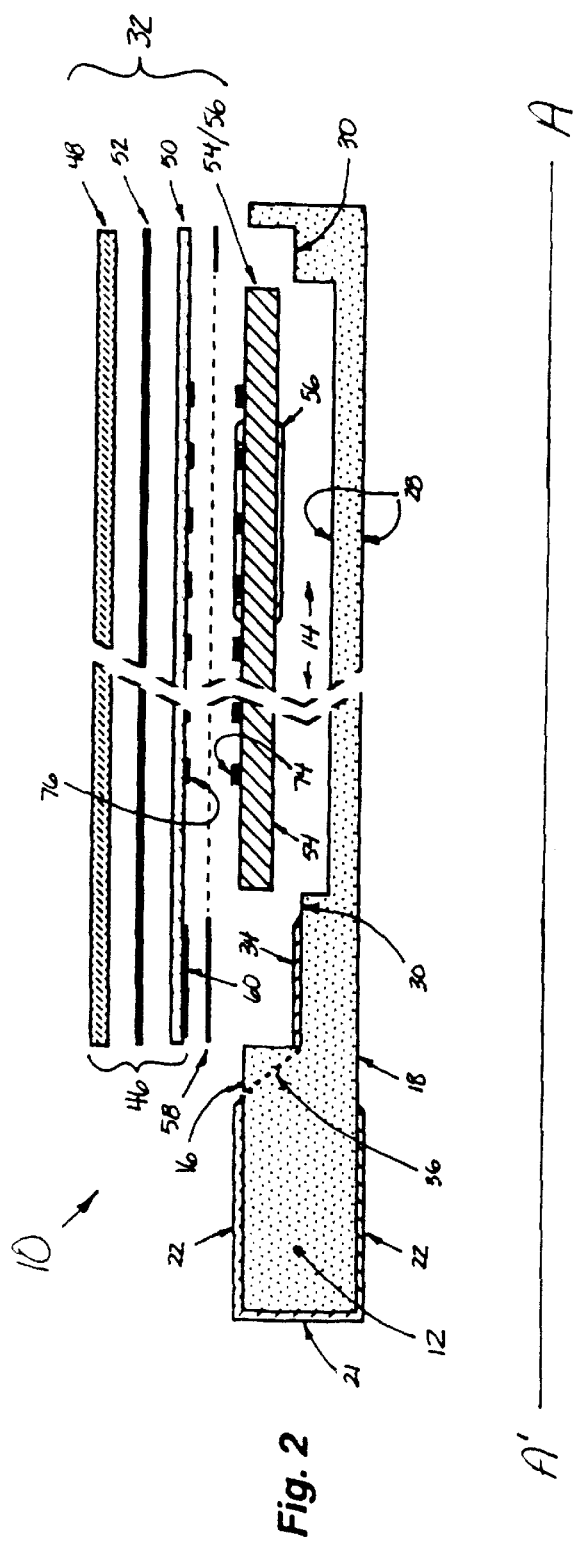
FIG. 2 is a cross-sectional view taken along lines A–A' of FIG. 1 showing details relating to electrical contacts of the molded module frame and composite semiconductor substrate subassembly of the present invention.
Figure 3:
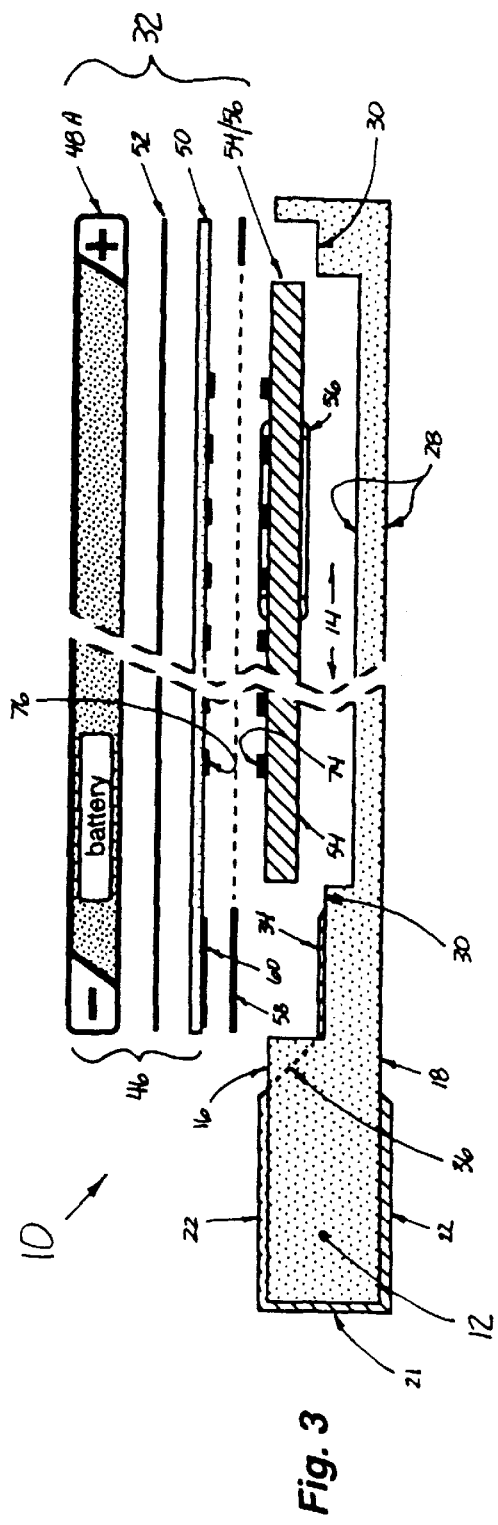
FIG. 3 is a similar view to that in FIG. 2 with exception that a thin rectangular battery is substituted for the thin metal cover plate.
Figure 5:
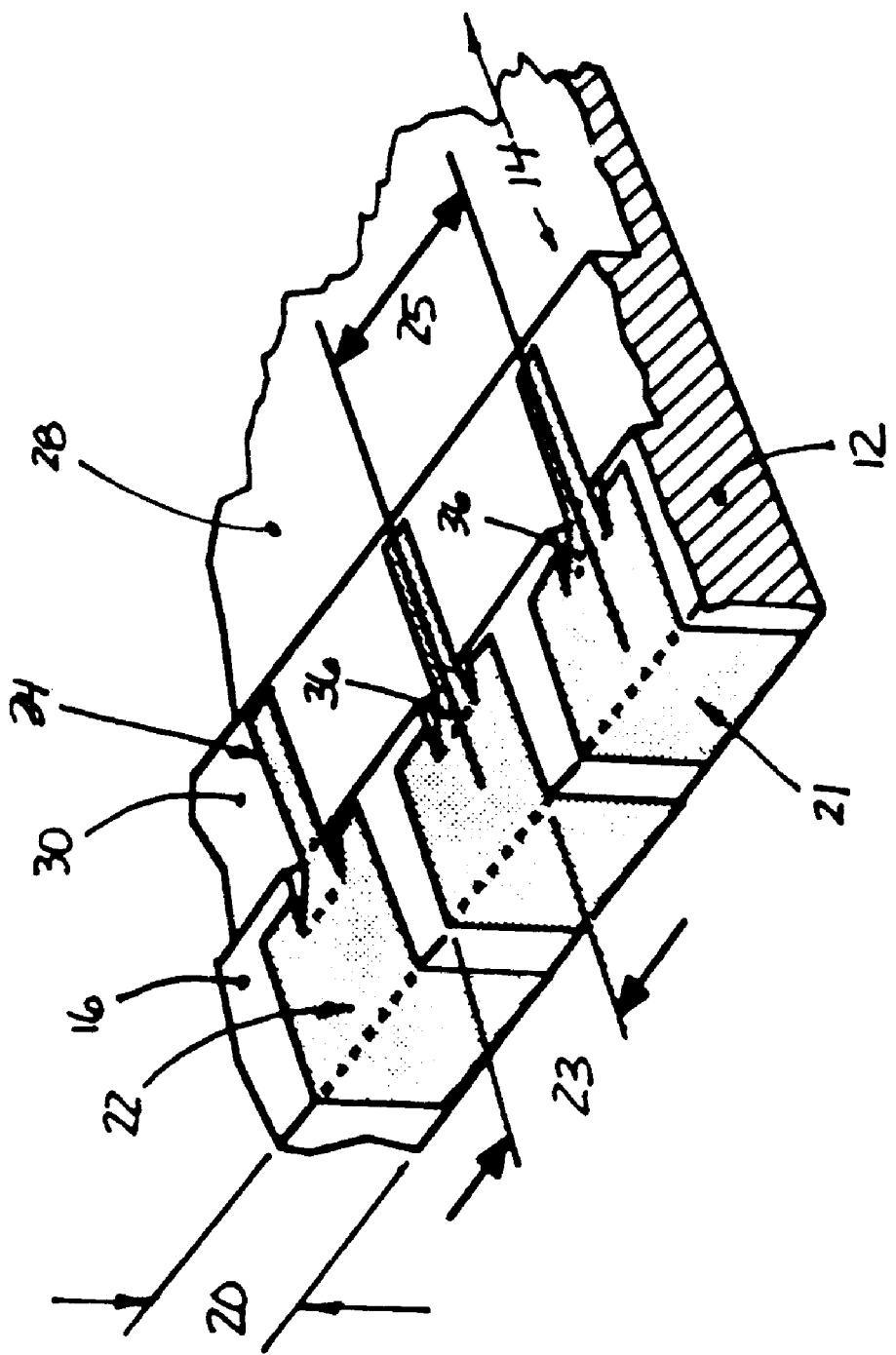
FIG. 5 is a perspective view of the electrical contacts of the molded module frame of the embodiments shown in FIGS. 1–4.

Referring again to FIG. 1, the array of contact pads 22 on the edge of the molded frame 12 are electrically connected to the interior stepped ledge 30 of the molded frame. As shown in FIGS. 2, 3 and 5, arrayed along the interior stepped ledge 30 are a multiplicity of termination pads 34, each electrically paired with an associated external contact pad 22. It should be noted that contacts in the preferred embodiment are arrayed along the edge(s) of greatest length, as shown in FIG. 1. However, in an alternate embodiment, the contacts can be arrayed along the edge(s) of the shorter length, in lieu of or in addition to contacts arrayed along the edge(s) of the longer length. In one embodiment of the invention, each of the contact pads 22 and termination pads 34 are formed by a selective plating process that deposits a conductive metal pattern extending from the edge of the molded frame 12, across the surface of the frame, and down a vertical wall or inclined plane 36, as shown in FIGS. 2, 3, and 5 and across the surface of the ledge 30. In embodiments having two internal cavities on opposite sides of the frame 12, similarly positioned pairs of contact pads 22 and termination pads 34 on opposite planes of the molded frame 12 can be electrically connected by an electrically conductive shunt 21 across the lower edge of the frame 12, as illustrated in FIGS. 2, 3, 5, and 14–14B, or left electrically isolated.

Plating techniques that can be commonly employed to produce the multi-leveled paths of electrical conduction on the molded frame include, but are not restricted to, electrolytic or electroless plated copper, nickel, gold, or tin/lead alloys. These and other pure metals and alloys can be selectively plated or deposited onto selected portions of the molded frame 12 via surface treatment and masking techniques known and available within the molded PCB industry. Alternatively, various plating and/or molding processes can be employed separately or combined with metal filled inks or powders to produce electrically conductive pads and traces on the molded frame through methods well known within the industry.

As the need arises for increasing numbers of control functions, signals and data in/out connections, the plating process can be adjusted to reduce the contact pad-width 23 and contact-to-contact pad-pitch 25, as shown in FIG. 5, or higher contact density can be obtained by integrally incorporating into frame 12 an array of stamped or etched metal contacts, as shown in FIGS. 6A–6C, or by inserting stamped or etched metal contacts into receptacles pre-molded in the edge of the frame 12, as shown in FIG. 6D. The array of stamped or etched metal contacts comprises a plurality of thin, closely spaced plates that are electrically insulated from one another by encompassing mold material or other insulator. The contacts can be incorporated into frame 12 as a separate pre-molded array, and molded simultaneously with frame 12, or applied after the frame is molded. These metal contacts have exposed edges extending from the bottom edge of the molded frame 12 across the contact pad surface plane and across the interior stepped ledge of the frame. The edges of the stamped or etched contacts can be recessed below, be substantially flush, or project above the surrounding molded surfaces.

The above-described electrical contact arrangement may be understood by referring to FIGS. 6A–6C. FIG. 6A is an illustration of an array 36 of individual contact members 38. The edges of the individual contacts 38 provide electrical interconnections across the interior ledge 30 and exterior surface of the frame 12 corresponding to the contact pads 22 and termination pads 34 discussed above. For example, once the array 36 of contacts 38 have been molded or inserted into the edge of the frame 12, as illustrated in FIGS. 6A and 6C, the edges 22' and 34' of the individual contacts 38 correspond to the respective contact pads 22 and termination pads 34 discussed above in connection with the prior embodiments. FIG. 6C is a cross-sectional illustration of the contacts positioned inside frame 12. This figure also illustrates an additional electrical contact surface resulting from the projection of an end portion 22" of a contact 38 from the edge of the frame 12, corresponding to element 21 of FIGS. 2, 3, and 5.

Additional embodiments based on the concept of integrally molded or insertable contact members are shown in FIGS. 7A–C, 8A–C, 19, 22, 27, 28, 29–29B, and 30. When contact members are formed by a stamping or etching process, simple appendages can be included to customize the contacts for a "through hole" leaded contact 37 or a "surface mount" leaded contact 39. Examples of these are illustrated in FIGS. 7A–C and 8A–C. Adjusting the centerline of the "through hole" lead 37' enables the distance, D, between the adjacent contacts 37 to be adjusted (D') for standard or non-standard hole patterns on the main circuit board as illustrated in FIGS. 7B and 7C, when adjacent contacts in the array are alternately rotated 180 degrees with respect to each other. By molding or inserting "surface mount" leaded contacts 39 in alternating orientations as illustrated in FIGS. 8B and 8C, solder pads on the main circuit board are optimally spaced on alternating sides of the module, and a more stable mounting base is provided with contacts 39'. Additional support is provided at both ends of the molded frame 12, as later described in connection with FIG. 9B, by inserting or molding a formed metal clip or post 41 into the bottom-end of molded frame 12.

Use of flat surfaced contact pads 22 located at the bottom edge of the molded frame 12, as shown in FIG. 1, is the preferred configuration for this invention for backward compatibility with present SIMM sockets. However, an alternative embodiment of the invention includes formed metal clips over the edge of the molded frame to produce a "leaded" version of the invention for direct solder mounting of the module to a PCB using either "through-hole" or "surface mount" soldering technology. FIG. 9A is an illustration of the molded frame 12 having a plurality of leads 40 attached to the contact pads 22 for use in a "through hole" soldering application. FIG. 9B is an illustration of plurality of leads 40' attached to the contact pads 22 for use in a "surface mount" soldering application. In this embodiment of the invention, an end post 42 integrally molded at both extreme ends on the molded frame 12 is included to assist in maintaining proper retention and alignment of the module in the main circuit board during the "surface mount" soldering process. These end posts 42 would typically be molded with differing cross-sectional diameters, i.e., one larger than the other, to mate with appropriately sized holes within the main circuit board, thereby enabling the modules to be correctly oriented and secured against movement during the soldering process.

Figure 9:
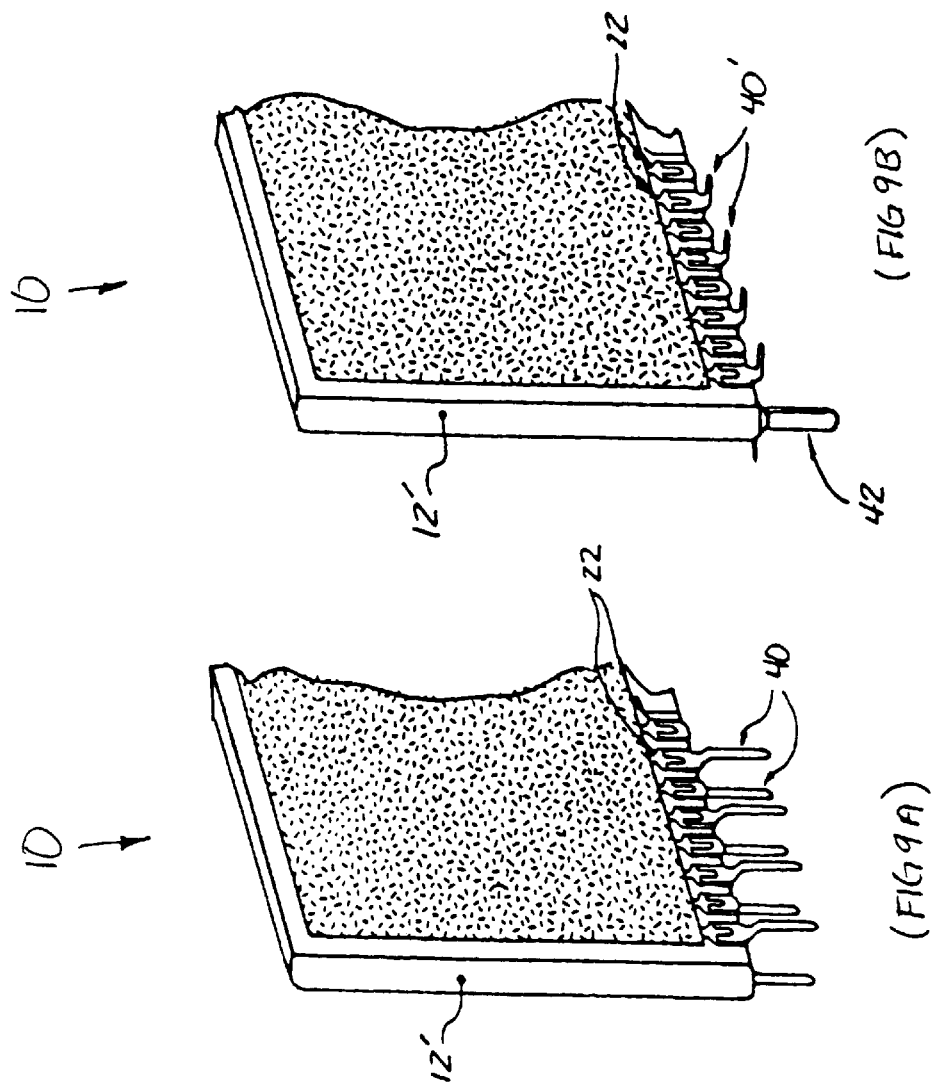
FIGS. 9A–9B show alternate embodiments of edge mount clips for electrical contacts on the molded module frame of the present invention.

In yet another embodiment, intended principally for frames 12 fashioned from a ceramic material, stamped metal leads are braze soldered or welded to metallized contact pads along the edges, resembling in appearance those shown in FIG. 9.

Yet another embodiment, designed principally for subassembly(s) 32 containing semiconductor or other devices which employ light emitting/receiving elements for chip-to-chip communication and data transfer, as discussed elsewhere, the frame 12 can include or substitute light channeling structures or elements such as fiber optic strands or bundles in place of conventional metal contacts. Alternately, frame 12 can be molded of an optically transparent material, fashioned to conduct light signals from the edges to interior devices, as previously mentioned.

In yet another embodiment (FIG. 29B), a 'z-axis' elastomeric electrical conductor can be integrally molded with molded frame 12, or inserted as contact members of an array.

Composite Semiconductor Substrate Subassembly

Details relating to the composite semiconductor substrate subassembly (abbreviated: "subassembly") 32 will now be discussed by referring again to FIG. 1. The subassembly includes a composite substrate 46 which comprises a thin metal cover plate 48 and thin laminate circuit 50 which is bonded to the metal cover plate 48 by a film adhesive 52. The composite substrate 46 provides a rigid mounting surface for the placement of semiconductor devices 54 and their associated passive components 56. The subassembly 32 is preferably attached to the molded frame by a rectangular ring 58 formed from an anisotropic, electrically conductive adhesive material. In its final form, the subassembly 32 total thickness, including semiconductor devices and passive components, would generally range from 0.010–0.040 inches in order to fit within the present 0.050-inch standard SIMM substrate thickness specification. However, in other applications, the individual subassembly and molded frame thicknesses may be appropriately increased or decreased to adjust for varying types of mounted devices, components, and structures on the module 10.

Cover Plate

The composite substrate employed in the present invention offers the advantage of allowing the devices to be pre-assembled, tested and repaired prior to final attachment to the molded frame 12. In the preferred embodiment, the cover plate 48 is formed from stainless steel and the thin laminate circuit 50 is a multilayered, thin copper/polyamide flexible circuit. However, materials other than those described above can be substituted for the cover plate 48 and the thin laminate circuit 50. Alternative material choices for the cover plate 48 include epoxy-glass PCB, molded plastic, glass, ceramic, ceramic-alumina, aluminum, silicon, silicon-nitride, carbon based materials, copper-nickel alloys and other metal and non-metal rigid and semi-rigid structures. The metal materials listed above offer advantages over other material choices, because of their thermal transfer properties.

1. Anti-Static Embodiments

In applications involving static sensitive semiconductor devices, electrically emissive semiconductor devices or devices switching or operating at frequencies above 50 MHz., the metal cover plate 48 can function as an electromagnetic shield or grounding plane by establishing an electrical ground potential across the cover plate. This is readily accomplished by direct electrical contact between one or more specific ground contact pads 22 and the cover plate 48, or through ground connections established through the thin laminate circuit 50. Additional anti-static protection in selective locations can be provided by including anti-static or electrically conductive filler materials in the mold compound when forming the molded frame 12 and/or adding specialized coatings as part of a post molded process.

2. Battery Back-Up

Referring now to FIG. 3, an embodiment is shown wherein a thin, rectangular battery 48A is substituted for the metal cover plate 48 of the composite substrate. In one embodiment, the battery 48A is the "Powerdex®" series of wafer-thin lithium batteries from Gould Inc., Electronic Power Sources in Eastlake, Ohio. The battery is appropriately connected in circuit with the semiconductor devices 54. The battery 48A is preferably connected to the semiconductor devices 54 by electrical contact between one or more specific ground and positive voltage contact pads 22, or through connections established through the thin laminate circuit 50. A connection between the thin laminate circuit 50 and the battery 48A can be achieved by electrical contact through conductive vias, windows, or an anisotropic conductive material, as described elsewhere. The battery 48A is preferably controlled by a low-voltage or low-current sensing device, for example, a device similar to that identified as part number MB 3790 available from Fujitsu Limited and Fujitsu Microelectronics, Inc., Japan. This type of device monitors in-circuit voltage/current levels and/or detects and regulates battery related functions such as charging and discharging current flow. When properly connected between the battery 48A and semiconductor devices 54, this embodiment enables prolonged data retention during intentional or unintentional interruption of the main power supply to the module, and is therefore particularly desirable for applications where the module is removed and transported between operating platforms. The sensing device is preferably included inside the module as one of the semiconductor devices 54. Alternatively, the sensing device may be mounted on the main circuit board.

3. Integral Components

Many applications require discrete resistors and/or capacitors (e.g. 56 of FIG. 1) or bulk capacitance in close proximity to the semiconductor devices with which they are electrically coupled. In another embodiment, cover plate 48 is fashioned from a ceramic or silicon based material with internal capacitor plate structures, inductive and/or resistive elements built into or on the surface which are electrically connected to the laminate circuit, thereby eliminating the need for these components 56 from having to be individually mounted to the surface of the laminate circuit along with the semiconductor devices.

4. Integral Semiconductor Devices

In another embodiment, cover plate 48 is fashioned from a silicon or sapphire (alumina oxide) based substrate in which conventional semiconductor devices are constructed such as memory cells, logic gates, digital-to-analog, analog-to-digital converters and other functions as are commonly manufactured within the semiconductor industry. In this example cover plate 48 can function independently of additional elements such as a separate thin laminate circuit 50 and devices 54, or be combined with one or more of these and other elements as described herein.

5. LCD Display

In yet another embodiment, cover plate 48 is fashioned from a transparent glass or plastic material compatible with liquid crystal display (LCD) or active matrix and other display elements. This embodiment enables text or graphical information to be displayed for the benefit of the user, such as information identifying the module type and configuration, amount and type of memory enclosed, or instructions regarding battery status and module removal and replacement procedures, or display an index of stored data.

Thin Laminate Circuit

Numerous materials may be substituted for the thin laminate circuit 50 without departing from the scope or spirit of the present invention. For instance, thin epoxy-glass PCBs, multi-layer ceramic circuits, screen printed conductive inks or vacuum deposited and/or plated thin film metals such as: chrome/copper/gold, aluminum, lead/indium or other evaporated metal and non-metal materials such as glass, optical transmissive fibers of glass or plastic and semiconductive materials containing doped and undoped regions and gallium arsenide (GaAs) materials as are commonly employed in the manufacture of semiconductor devices, and electrical insulative materials including polyamide coatings or film, polyester film or "GoreTex™" laminates, are all alternative substitutes for the preferred thin laminate circuit. In some instances, a film adhesive 52 may not be required. For example, a thin laminate circuit 50 fabricated by sequential deposition of copper/polyamide thin films directly onto the cover plate 48 would not require an adhesive. These materials are preferred for high frequency applications associated with controlled or matched impedance circuits employing microstrip, stripline and/or wave guide structures as part of the laminate circuit.

Figure 12:
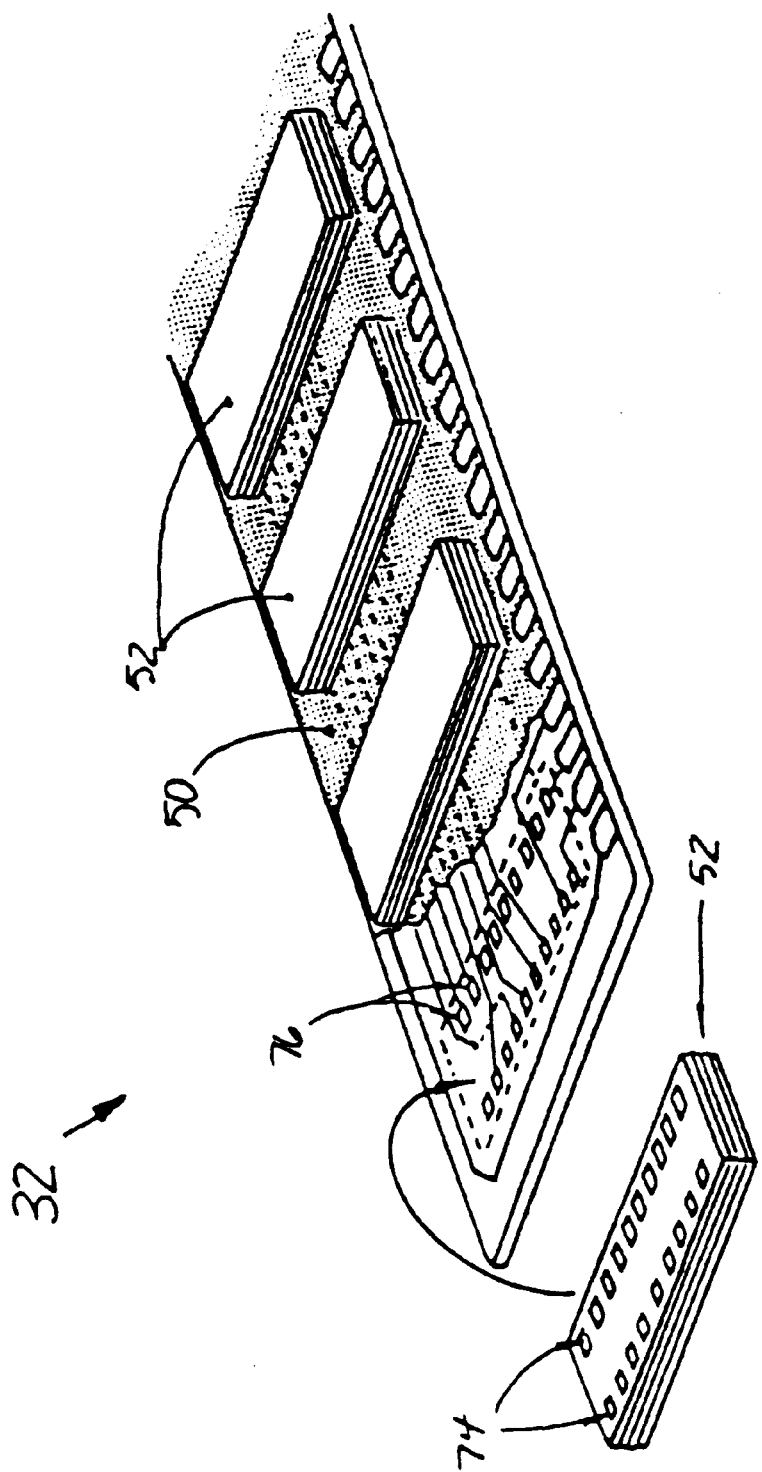
FIG. 12 illustrates an implementation of stacked memory chips for use on the composite substrate assembly of the present invention.

The primary purpose of the thin laminate circuit 50 is to provide electrical or optical interconnection between individual electronic devices 54 and discrete components 56 or a group of stacked electronic devices 52 (refer to FIG. 12)

mounted on the circuit 50, and to conduct data signals and control voltages to and from the termination pads 34 or 34' on the molded frame 12. To facilitate transfer of these signals and voltages, a series of electrically conductive substrate pads 60 or optical couplers (not shown) are arrayed along one or more edges of the thin laminate circuit 50 such that when subassembly 32 is attached to the molded frame 12, substrate pads 60 and/or optical couplers overlay or align and connect with corresponding termination pads 34 or optical couplers on the molded frame 12. Voltage and data signals applied to termination pads 34 or optical couplers are connected through substrate pads 60 or optical couplers of the thin laminate circuit 50 and carried through multiple lines and traces or optic fibers residing on the surface or placed within internal levels of circuit 50 to surface bond pads 76 or optic terminations that surround or underlay individual semiconductor devices 54 and passive components 56. Devices 54 and components 56 are in turn electrically and/or optically connected to bond pads 76 or optic terminations on the laminate circuit 50. In this manner, semiconductor devices and passive components are connected in circuit and are able to exchange data, control signals and voltages between one another and between contacts 22 arrayed along one or more edges of the molded frame.

Figure 4:
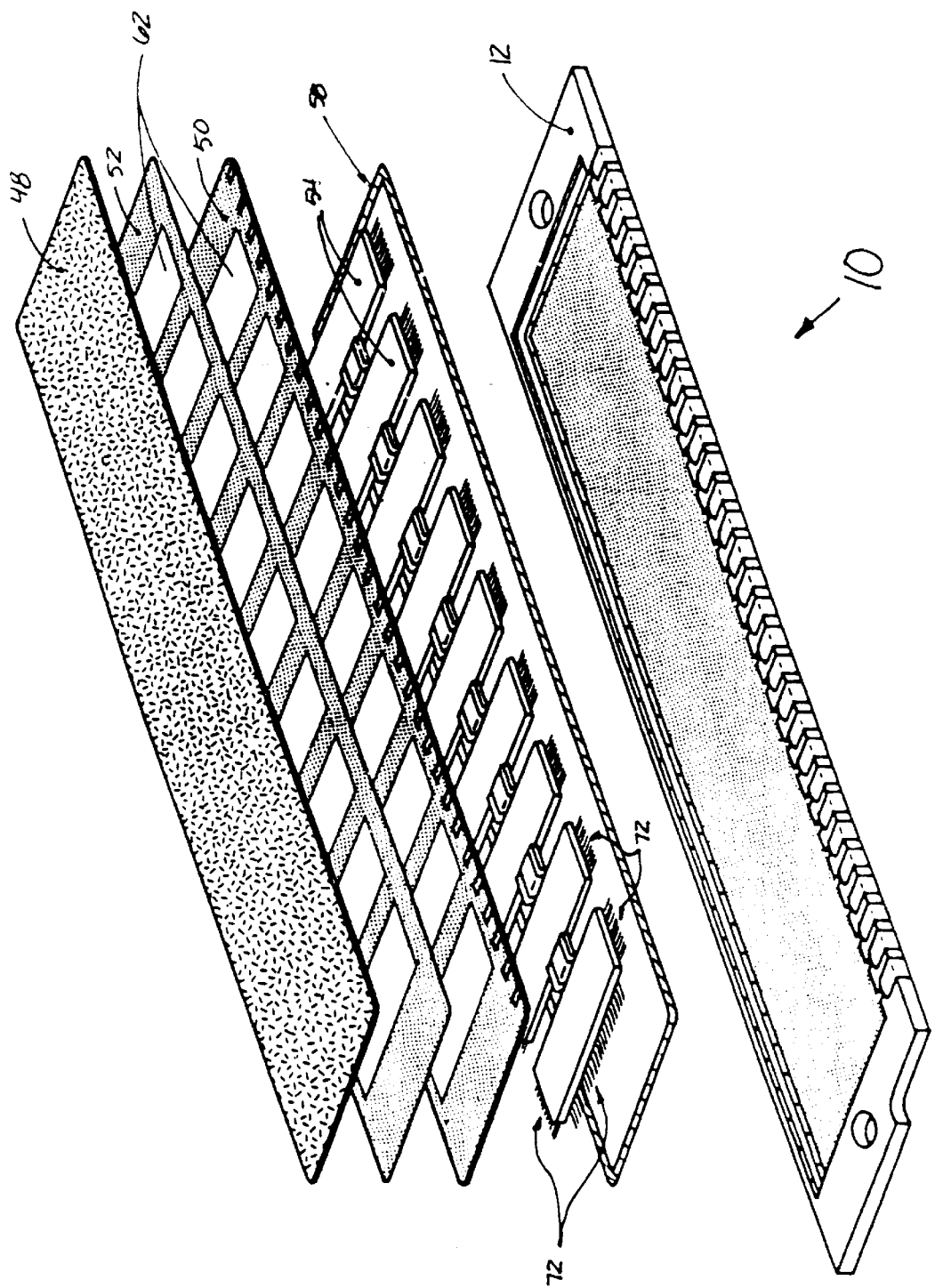
FIG. 4 is an exploded view of the major components of an alternate embodiment of the thin multichip module of the present invention.

As previously described, other embodiments, which employ a cover plate 48 fashioned from a silicon or sapphire based substrate(s) with integral semiconductor devices, would not require a separate thin laminate circuit 50. Device interconnects, substrate pads 60, and/or optical couplers in these embodiments, would be incorporated into or upon the cover plate material itself 1. Thermal Enhancements In the preferred embodiment, the semiconductor devices 54 and discrete components 56 are attached to the surface of the thin laminate circuit 50, requiring any heat generated from the devices to pass through circuit 50 and adhesive 52. To lower thermal resistance and, hence, enhance thermal conduction of the heat generated by the semiconductor devices contained inside the module to the exterior surface of the module, several features can be incorporated as part of the thin laminate circuit 50 or cover plate 48. Maximum thermal conduction is achieved by incorporating open windows 62 within the thin laminate circuit 50 and if present, adhesive 52, to allow backside chip attachment directly to the cover plate 48, as shown in FIG. 4. Chip attachment can be accomplished using eutectic alloying materials (e.g., solder), metal filled epoxy or other thermally conductive adhesives.

Figure 10:
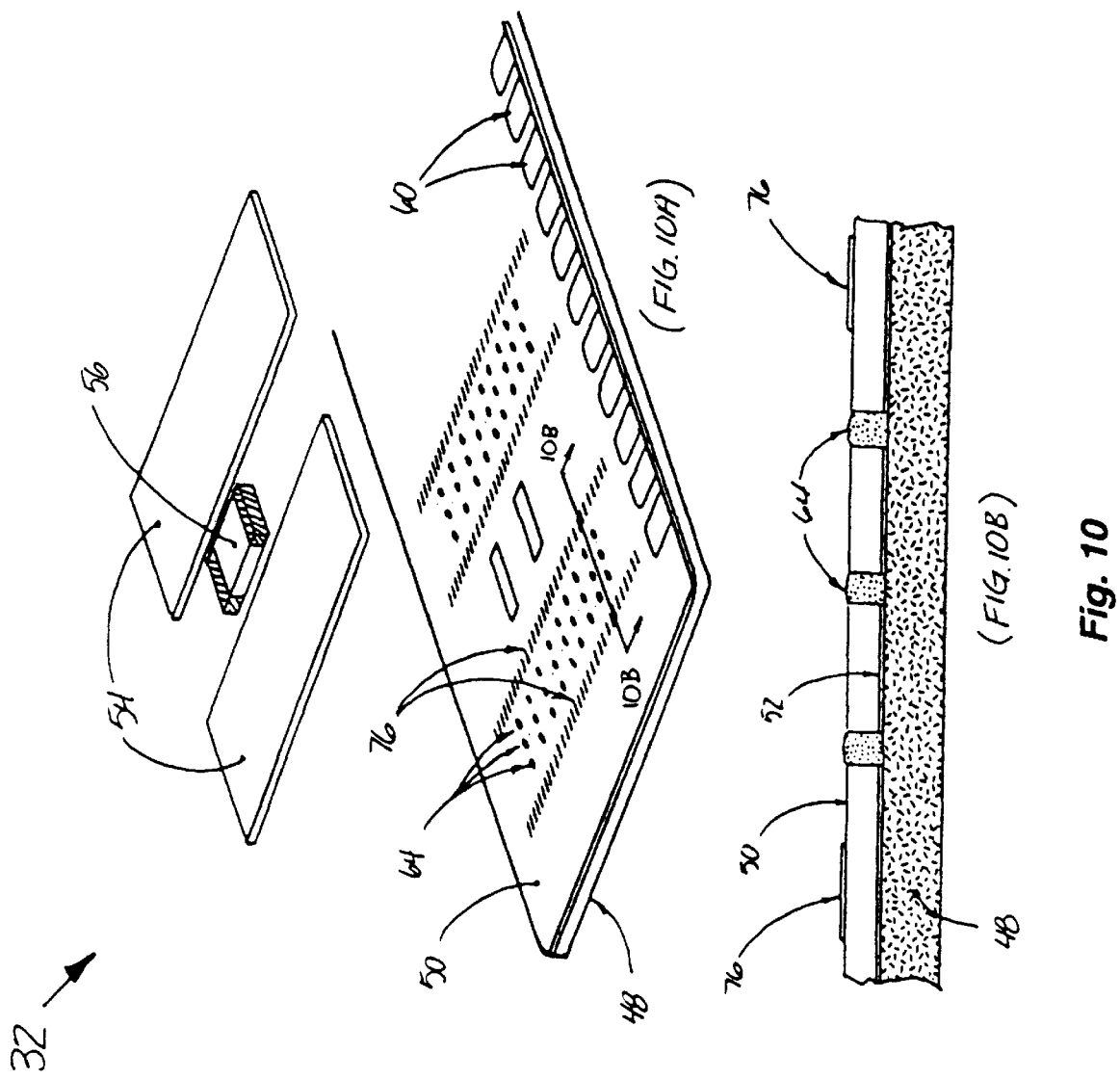
FIGS. 10A–10B illustrate optional thermal dissipation features built into the thin laminate circuit of the composite substrate of the present invention.

An alternative approach to lower thermal resistance makes use of small thermal vias 64 illustrated in FIG. 10, formed as an integral part of the thin laminate circuit 50. Strategically arrayed under selective chip mounting sites, as shown in FIG. 10A, these structures consist of solid conductive posts or channels through circuit 50 and if present adhesive 52, into which a thermally conductive material is emplaced. Intimate thermal, metal-to-silicon, contact is then established between the cover plate 48 and semiconductor device 54 at localized areas beneath semiconductor devices 54.

Figure 11:
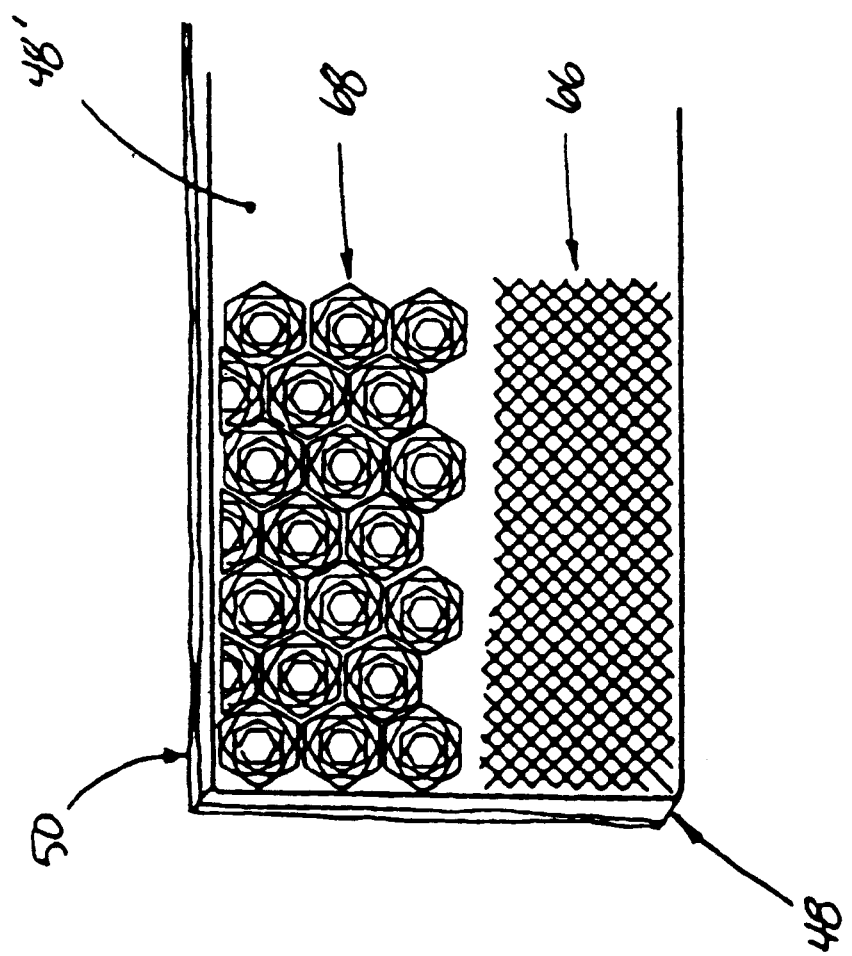
FIG. 11 illustrates optional thermal dissipation features formed on the outside surface of the composite substrate of the present invention.
Figure 29:
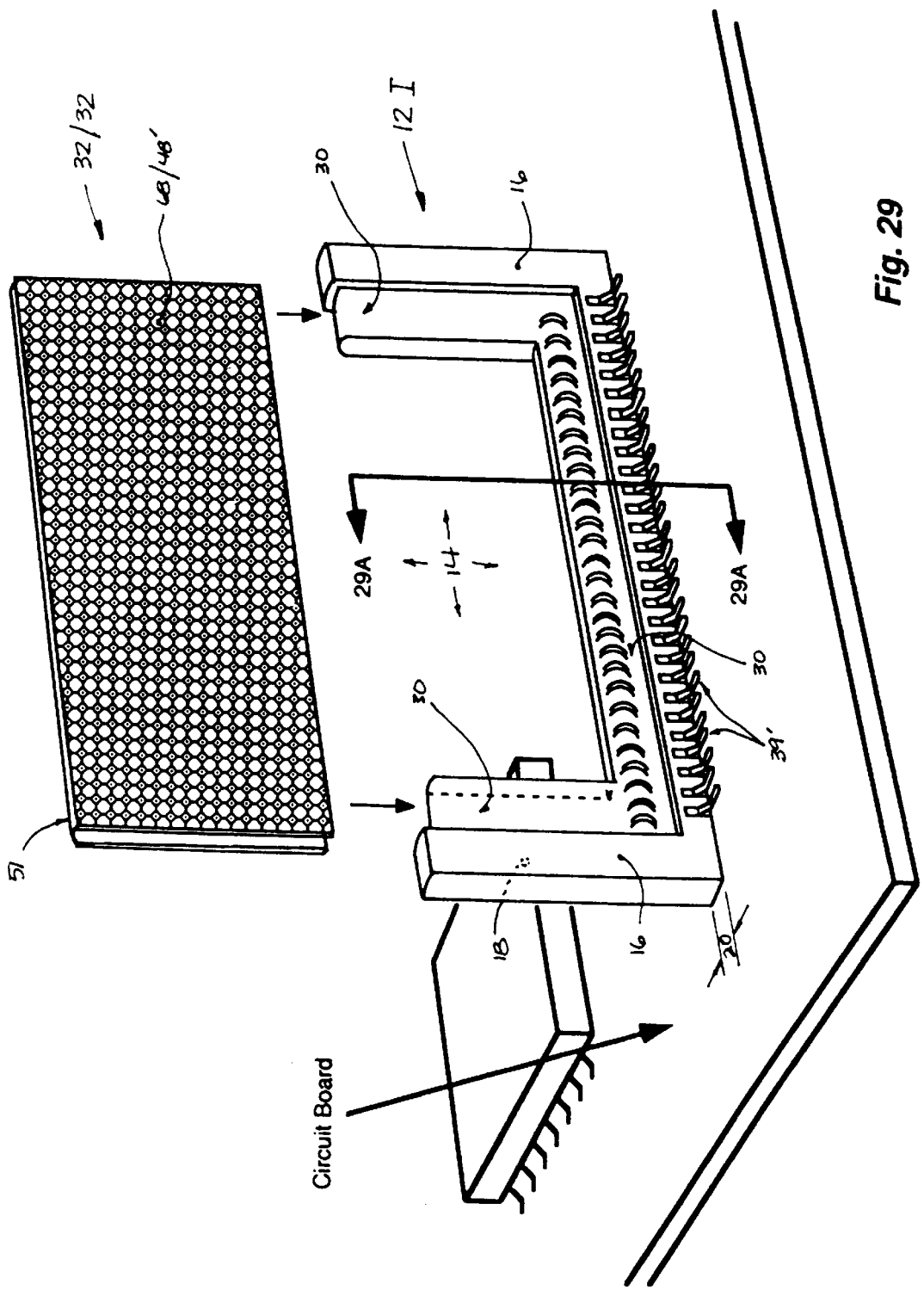
Figure 30:
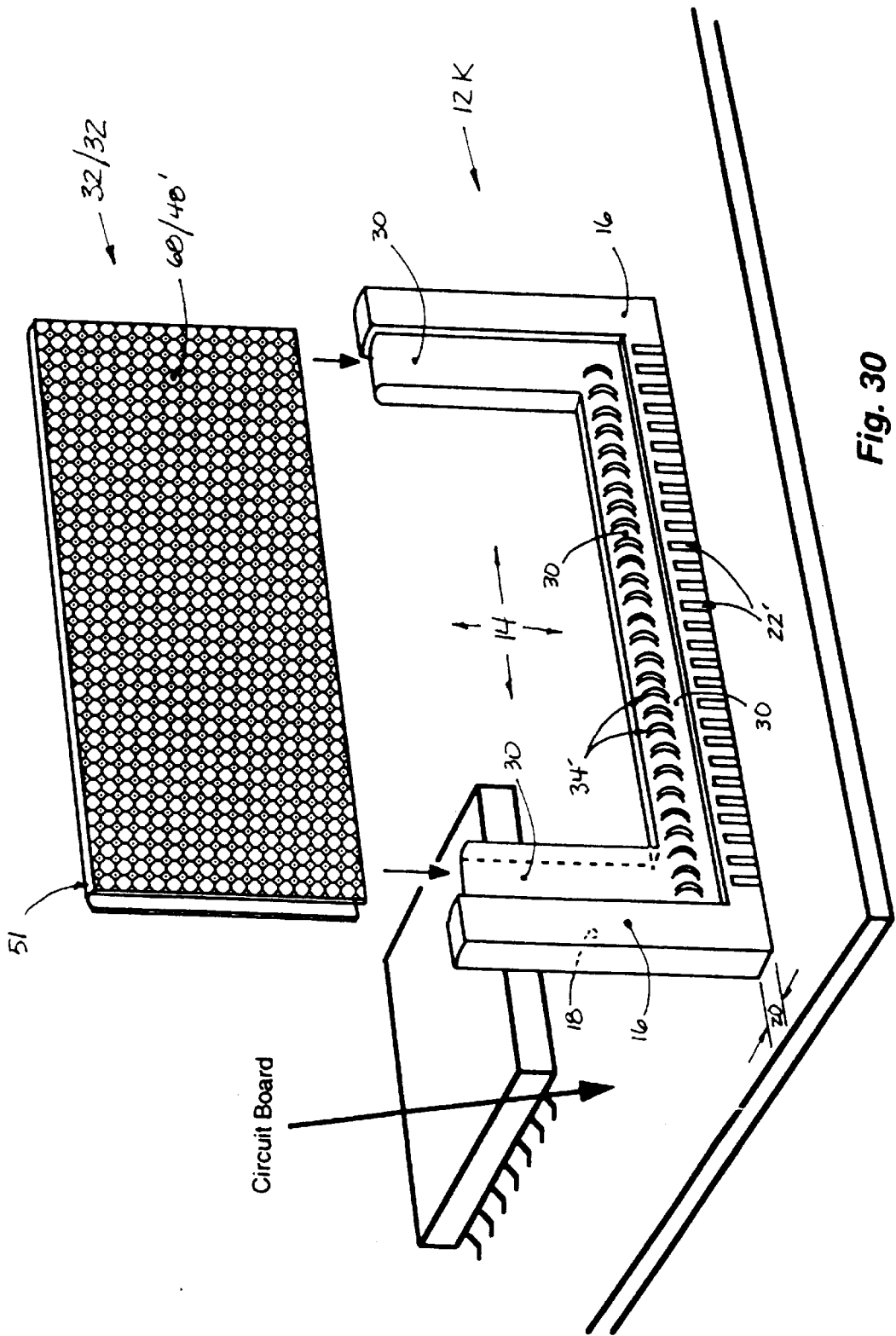
FIG. 30 illustrates a perspective view of the module in FIG. 21 being mated to a module frame socket exhibiting contacts similar to FIG. 6.

Another enhancement for improving thermal convection, or transfer of heat into the ambient air surrounding the module, involves the incorporation into the external surface 48' of the cover plate 48, a knurled surface finish 66 or uniform array of small, multi-tiered, polygon structures 68, for the purpose of increasing the total external surface area of cover plate 48, as illustrated in FIGS. 11, and 29–30.

In yet another embodiment of this invention, cover plate 48 and frame 12, alone or in combination, can be manufactured to contain multiple compartments or channels through which gas or liquid coolant materials can be circulated to effectively distribute or remove heat generated from contained semiconductor devices. For instance, a miniature cryogenic pump (not shown) can be fashioned into cover plate 48, consisting of an enclosed expansion chamber connected to small entrance and exit channels that closely parallel one another in a sinuous path. When a gas (air, nitrogen, etc.) is introduced from an appropriate high pressure source or generator through the entrance channel into the expansion chamber, a localized pressure drop caused by rapid expansion of the gas results in an associate temperature drop of the gas. When re-circulated out an exit channel placed in close sinuous proximity to the entrance channel, the cooler exit gas conducts heat from incoming gas and progressively lowers the temperature of the cover plate 48. Alternatively, cover plate 48 may be fashioned as a thin "heat pipe" in which an appropriate fluid or gas is contained and self-circulated by fluid/gas dynamics caused by conversion of the fluid or gas into a state of lower density upon contact with a high heat generating source and consequent movement to a cooler region of the cover plate or extension thereon and subsequent recondensation or re-densification upon exchange of the latent heat into ambient air or other cooling material.

2. Optical Signal Communication

Signal communication between adjacent devices 54 and/or opposing subassemblies 32 will typically be accomplished through electrical conduits of lines and traces embedded in or fashioned on the thin laminate circuit 50. However, since it is expected that semiconductor or other electronic devices employing light emitting/receiving structures on their respective surfaces or edges will eventually become practical alternatives for chip-to-chip communication, this invention provides a compact, "light-tight" enclosure for shielding these components. With this application in mind, point-to-point, data/signal transmission can occur across the narrow air gap between juxtaposed semiconductor devices which are accurately aligned or positioned in a face-to-face, edge-to-edge or other configuration with one another; thereby eliminating the necessity for long crossover electrical paths (21, 37–39, 51, 51A, 53, and 78) through the thin laminate circuits 50 and across the stepped ledge 30 or edges 20.

Therefore, in an alternate embodiment, the semiconductor devices on adjacent or opposite surfaces of subassemblies 32 transmit and receive data or signals through light emitting and/or light sensing elements of the semiconductor device(s) itself. In this embodiment, the protective overcoat compound is eliminated or optically transparent or transmissive at the wavelength frequency of the light. To enhance light transmission between such semiconductor devices, a solid glass or semi-rigid plastic or elastic or resinous polymer or other material exhibiting fiber-optic like properties is molded, injected, coated, dispensed or applied as a film to bridge the gap between such semiconductor devices within this module and to conduct the light in essentially uni-directional or multi-directional paths.

In yet another embodiment, the subassembly cover plate 48 or substrate 50, alone or in combination, is an alternate source for the light emitting and light receiving elements. In other words, structures are embedded in or on the surface of the substrate and/or cover plate which transmit and/or receive light. Such structures include gallium arsenide (GaAs) coatings or deposits over silicon, polysilicon, alumina nitride or oxide, or optically transparent glass or plastic, to produce photo diodes, or other light emitting (LED) and light receiving/sensing devices. The cover plate may be the source for the light emitting/sensing elements while an otherwise optically transparent substrate may contain electrical conductive elements. Likewise, the cover plate may contain electrical conductive elements while the substrate may be the source for the light emitting/sensing elements.

Subassembly(s) Attachment to the Module Frame or Module Frame Connector Socket

Electrical and mechanical mating between the subassembly(s) 32 and the module frame 12–12C and/or module frame socket 12D–12K is accomplished by one of several methods. In the preferred embodiment, an anisotropic, electrically conductive, adhesive film 58, available from several manufacturers, is used. This material characteristically conducts electrical current perpendicular to the plane of the film in a direction across its thickness, but is essentially non-conductive in directions parallel to its planes. This material is pre-positioned as either a dry-film preform or can be dispensed through a syringe, or stenciled or transfer stamped in a liquid state, then dried in place on either pads 60 of subassembly 32 or pads 34/34' of molded frame 12. Electrical and mechanical attachment is then accomplished by applying thermal energy and/or exerting pressure between the mating surfaces in accordance with the manufacturer's instructions. Alternatively, a solderable alloy combined with a contact or thermal setting adhesive may be selectively applied as described above and thermally, sonically, or pressure activated to effect both a mechanical and electrical interconnection. Yet another material that is suitable is commonly referred to as a 'z-axis elastomeric conductor', fashioned from a material with adhesive properties to effect simultaneous mechanical and electrical attachment between the subassembly 32 and the molded frame 12. Yet another method makes use of molded appendages, slots, holes, ribs and/or structures on the molded frame that can be sonic welded or thermally deformed to attach subassembly 32 to molded frame 12 and establish electrical contact or optical coupling between pads 60 or optical couplers of subassembly(s) 32 and pads or pins 34/34' or optical couplers of molded frame 12. In other embodiments of the module wherein the subassembly(s) are intended to be semi-permanently attached (i.e. removable) to a module frame socket (FIGS. 12D–12K), the subassembly (s) are pressed or slid into position over the socket and held in mechanical, electrical or optical contact by means of a pressure or friction fit between the mating surfaces. Molded features residing on the molded module frame 12 and/or module frame socket can be employed to capture and secure the module within or against the socket through multiple means including spring, wedging, and/or pinching action exerted against the contact pads or pins. These and other features are illustrated and discussed below with reference to FIGS. 19, 22, and 26–30.

Device Attachment

Semiconductor device attachment to the thin laminate circuit 50 is achieved by one of several methods commonly known and available with the industry. Tape Automated Bonding (TAB) technology provides a network of tab leads 72 attached to metallurgical bumps formed at specific bond-pad sites 76 of the semiconductor device. TAB leads connected to the bumps are elevated from the surface and extend beyond the perimeter of the silicon device, as partially shown in FIG. 4. The free ends of the TAB leads may be mechanically/electrically bonded to appropriately spaced and metallurgically compatible bond pads 76 (ref. FIG. 10) on the laminate circuit 50 with the silicon device(s) placed in either a face-up or face-down configuration. Alternatively, the devices are attached using 'Chip On Board' (COB) technology where the chip is mounted with an epoxy paste or solder alloy in a face-up orientation, and electrically connected to the laminate circuit 50 with conventional wire-bonds 73 as illustrated in FIGS. 18A–18C, and 24. Yet another, and preferred technique, shown in FIGS. 2, 3, 10, 12, 14–16, 18D, 21–23, and 26–29A, is known as Flip Chip Assembly or Direct Chip Attach (DCA). In this example, suitably placed and sized bond pads 74 on the face of the semiconductor chip(s) are directly attached and electrically connected to matching bond pads 76 on the laminated circuit 50 through one of several techniques and material choices. Examples include, but are not limited to: 'Controlled Collapse Chip Connection' ("C4") soldering technology developed and licensed by IBM, conductive epoxies and polymers, solder-ball reflow, anisotropic conductive adhesives, as previously described, and metallic coated, raised, silicon or silicon-carbide structures such as those developed by Elm Technology of Santa Barbara, Calif. The aforementioned structures are designed to pierce oxidation coatings of either pad site and effect a permanent electro/mechanical bond between the semiconductor device and laminate circuit. Other micro-machined or etched structures can be formed on the pad surfaces to permit a "Velcro"-like electro/mechanical attachment of the semiconductor device to the laminate circuit. Typically these chip mounting methodologies are combined with specific chip undercoating or overcoating materials to enhance mechanical reliability, hermeticity and/or thermal conductivity. [Note: In some instances of device mounting methodologies, it is preferable that cover plate 48 and thin laminate circuit 50 be selected from materials exhibiting coefficient of thermal expansion characteristics, either independently or in combination, which match or approximate that of the chip devices attached thereon to promote better mechanical reliability of the attachment bondline.]

Device Types

As shown in any of the various embodiments, a variety of semiconductor devices 54 are readily assembled into the module of the present invention. Typical devices include, but are not limited to, Memory chips (DRAM, AS-DRAMs, Flash-EEprom, ROM, Fast/Slow-Static RAMs, Ferroelectric RAM, et. al.), Microprocessor, Application Specific IC's (ASICs), Gate Array devices, Telecommunication IC's and others manufactured in CMOS, BiCMOS, GaAs and other technologies compatible with TTL, ECL, FAST and other logic interface standards. Typical applications in which this invention would find usage include main memory storage or digital and analog signal processing for devices such as: handheld personal digital assistants (PDA's), sub-notebook and notebook sized computers, desktops, workstations, mainframes, file-servers, and super-computers, and other graphic intensive applications, such as high definition television (HDTV), "on-demand" video storage and server units, handheld personal communication and data/information display devices.

In the various embodiments, the semiconductor devices 54 are not pre-encapsulated, but rather comprise "bare" silicon die. In other words, silicon die are attached directly to the composite substrate. The semiconductor devices are not prepackaged with TSOP or SOJ-type molded packages.

1. Stacked Memory Chips

In some high performance applications, such as for super-computers, an even higher packaging density can be achieved by combining this invention with stacked memory chips 52, to produce another embodiment detailed in FIG. 12. Stacked memory chips 52 are available, for example, from Irvine Sensors Corp. of Costa Mesa, Calif. and IBM at its facility Burlington, Vt. These stacked chips are preprocessed through a wafer back-lapping operation, to substantially reduce the device thickness, before the individual chips or wafers are glued together to form short, vertical, interconnected, 3-D memory stacks. These memory stacks can then be directly face-bonded (DCA or Flip Chip mounted) or otherwise connected to the thin laminate circuit 50 as described above. This embodiment is also warranted for applications in which volumetric space is extremely limited.

Figure 12A:
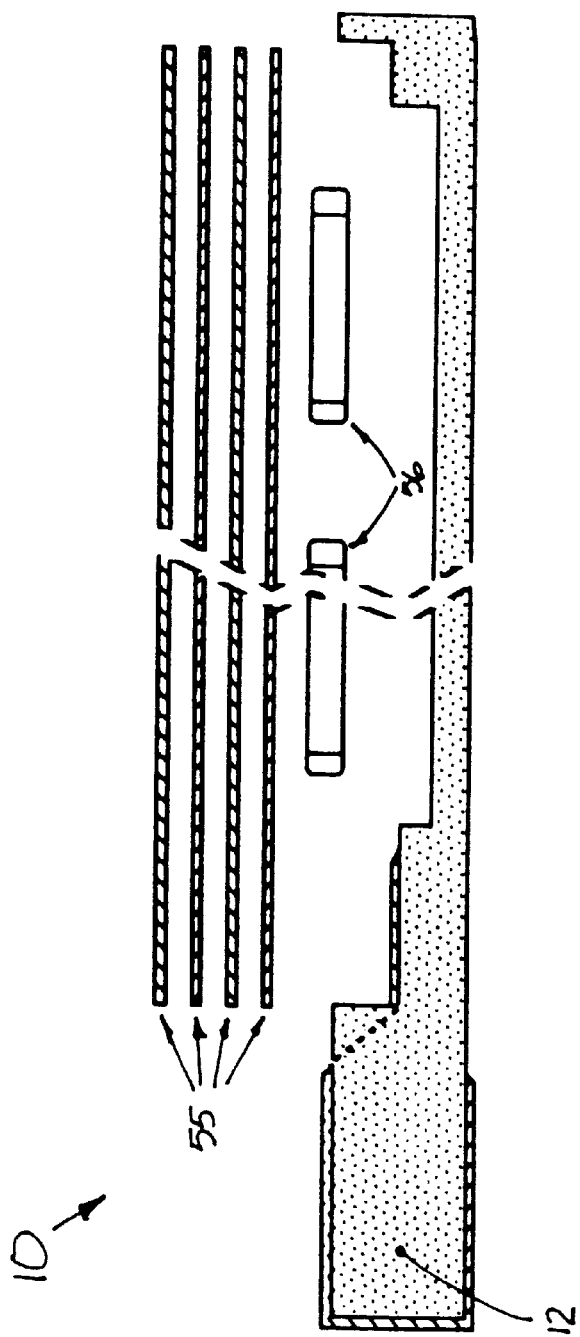
FIG. 12A illustrates an embodiment using standard silicon plates in lieu of the substrate subassembly.

In an alternate embodiment of this invention, illustrated in FIG. 12A, cover plate 48 may be fashioned from several thin sections of silicon wafers 55, each section containing multiple devices interconnected from device-to-device within a specific section, and each section in turn layered on top of one another and interconnected from layer-to-layer by means of metal or other electrical conductive material and/or optical coupling across the edges of the resultant stack of wafer sections or through vias etched or abraded through the wafer sections. The resultant cover plate can then be attached to the molded frame or module socket as discussed herein. Elements 56 are preferably used as decoupling capacitors.

2. Security Devices

Microprocessors and memory chips are relatively expensive. Since multichip modules can contain a number of these devices in a compact, easily hidden and transported package, and in particular the thin multichip module described herein, these products are expected to be targets for high-tech crime. Consequently, a unique and potentially important embodiment of this invention is the inclusion of anti-theft detection and/or location devices within the module to aid recovery or render the modules inoperative for unauthorized usage. A variety of security devices can be incorporated within the module as one of the semiconductor devices 54 to emit detection signals in response to scanning hardware or require a user-specified access or encryption code to properly function. These security devices are preferably implemented as an ASIC comprising one of the semiconductor devices 54 in any of the various embodiments. These security devices are accessible only by disassembly, which essentially destroys the module.

Passive Components

In addition to the variety of semiconductor devices that find application in this invention, associated passive electronic components 56, including chip capacitors, resistors, etc., can also be surface mount soldered onto the thin laminate circuit. Chip decoupling capacitors are used in particular with memory devices to function in the suppression of spurious voltage spikes when electrically connected between a net positive or negative voltage reference and electrical ground. For some applications, these passive components 56 will stand slightly above the mounted height of the adjacent semiconductor devices 54, as shown in FIGS. 2, 3, 10A, 13 and 17. Since these components are generally composed of a robust ceramic material, they can be advantageously employed to prevent direct pressure from being applied against the fragile semiconductor devices should the assembled module be compressed in an axis perpendicular to the outer surface(s) of subassembly(s) 32. Alternatively, special raised stand-off features can be integrally molded into the floor 28 or across the cavity of the molded frame 12 to prevent damage resulting from compressional forces. Alternatively, the semiconductor devices would be protected through the addition of an overcoated plastic compound as described below.

Multiple Subassemblies

Figure 13:
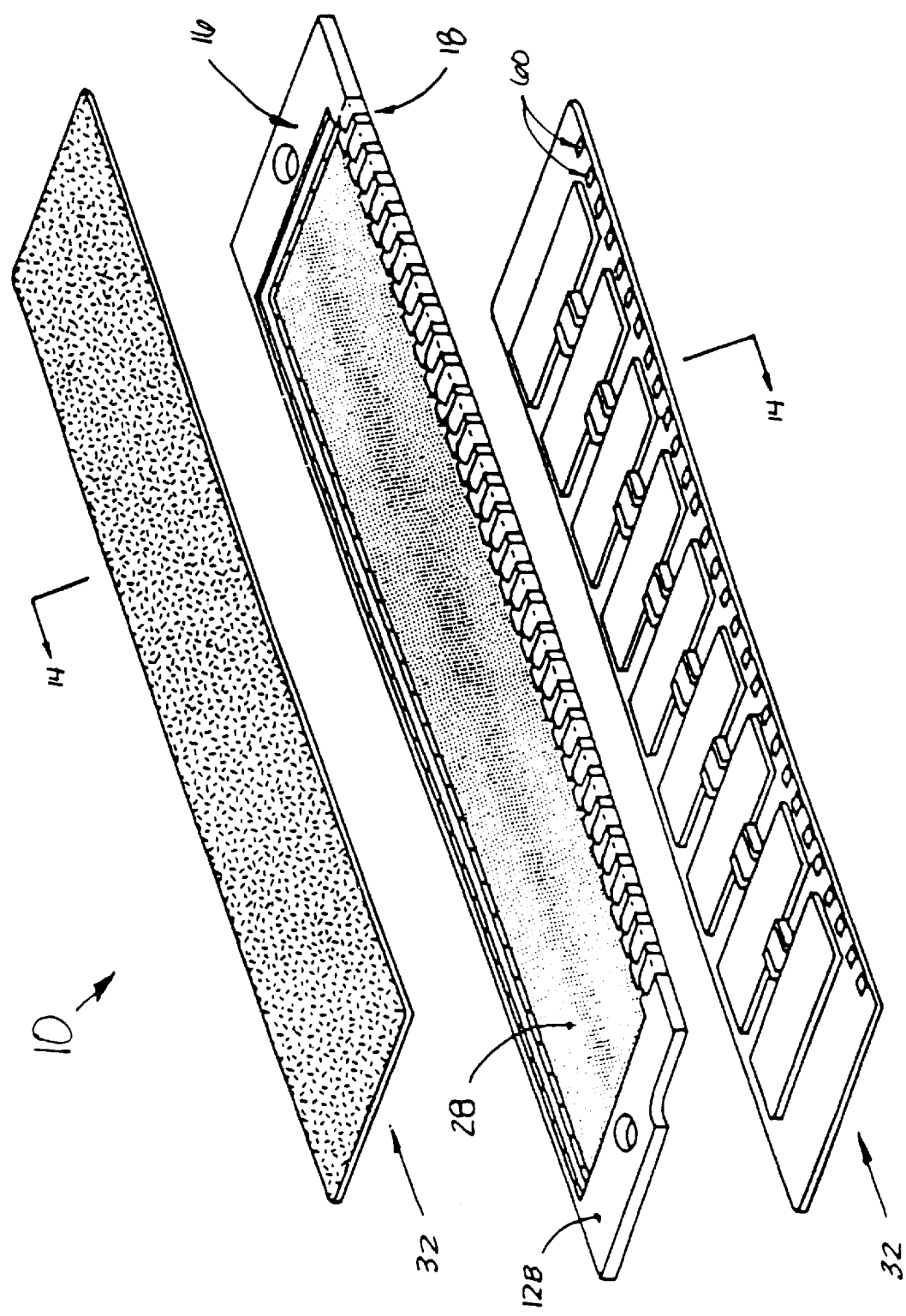
FIG. 13 is a exploded view of the major components of an alternate embodiment of the thin multichip module of the present invention comprising multiple composite semiconductor substrate subassemblies (hereinafter referred to as "subassemblies")
Figure 14B:
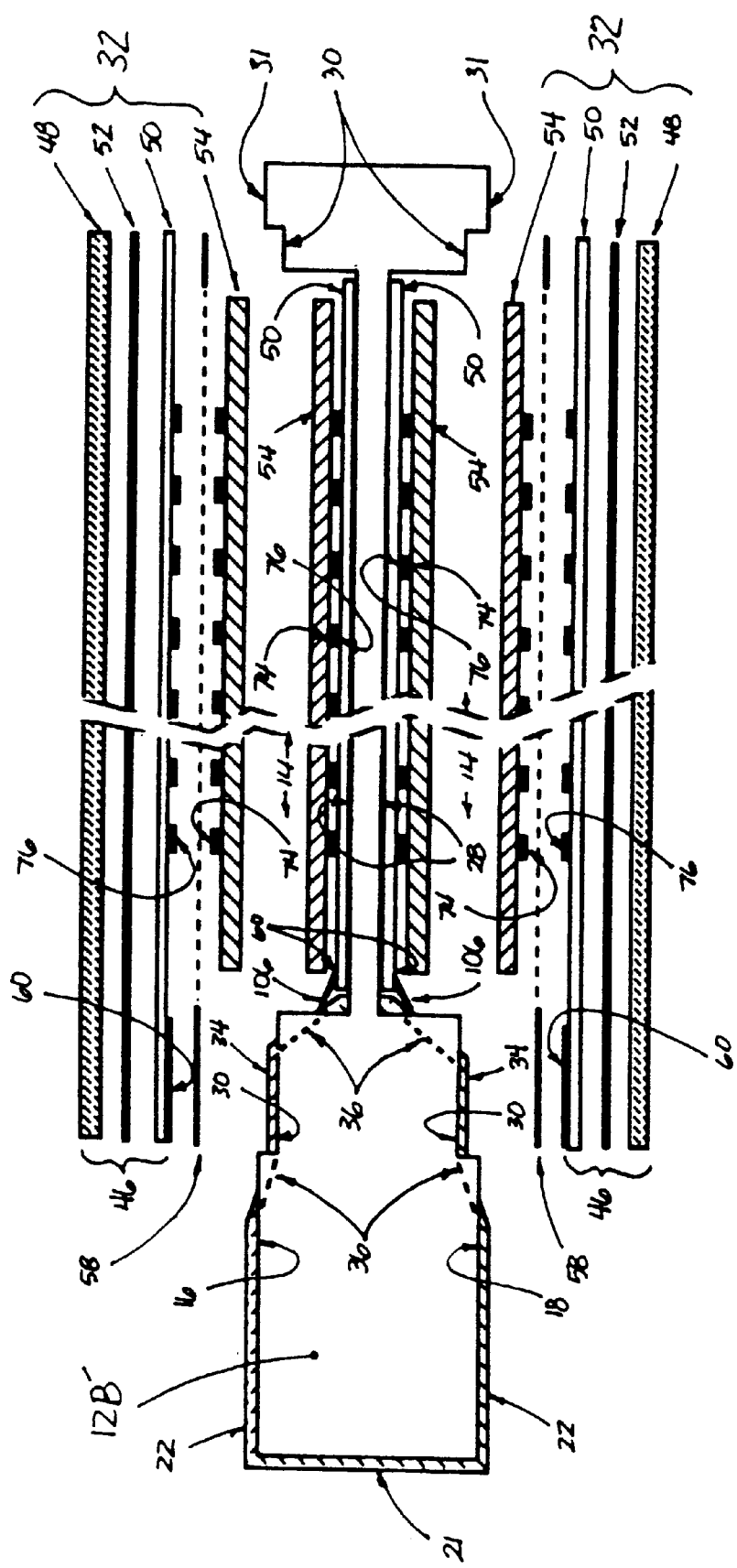

Referring now to FIG. 13, an embodiment of the present invention which includes a frame having cavities 28 on opposite sides of the frame 12B is shown. Only one cavity is shown in FIG. 13, the cavity 28 on the other side of the frame being hidden in this view. A substrate subassembly 32 mounts in each of the respective cavities as shown. FIG. 14 is a cross-sectional view of FIG. 13. FIGS. 14A and 14B are alternate embodiments of FIG. 14 with a different molded frame 12 that places the subassemblies 32 further away from the center line of the molded frame 12, thus allowing more spacing for internal components.

As shown in FIG. 14B, a second thin laminate circuit 50 is attached to the floor 28 of the molded frame 12 in addition to the thin laminate circuit 50 on the cover plate(s) 48. Tab leads 106 or pads arrayed along the edge(s) of this extra circuit 50 are electrically connected to appropriately sized and positioned termination pads 34 located along an additional stepped ledge adjacent the floor 28, or to a row of contacts spaced along the floor 28 of the molded frame 12. An additional plurality of semiconductor devices 54 are optionally mounted to this second thin laminate circuit 50. Another embodiment,—principally suitable for a molded frame 12 formed from multiple, stacked, layers of kiln-fired, ceramic sheets imprinted and interconnected with electrically conductive lines, vias and pads,—can incorporate the circuit as an integral part of the floor 28 of the module frame 12, such that the uppermost layer constitutes the device and component attachment surface. In these embodiments, semiconductor devices 54 can be attached to the first laminate circuit 50 as discussed in connection with FIG. 1 and a second set of semiconductor devices 54 can also be connected to the second laminate circuit integrated into the floor 28.

In yet another embodiment similar to FIG. 14B, a thin printed circuit board (PCB) may be substituted for floor member 28 upon which semiconductor devices 54 can be mounted. This embodiment is particularly compatible with memory card devices that conform or are similar in form, fit, or function to those standardized by the Personal Computer Memory Card International Association of PCMCIA. In this embodiment, additional device mounting surfaces made available with the addition of subassemblies 32 enable a doubling of available component capacity or provide for a better thermal management of heat sensitive or producing devices than current PCMCIA type cards. It is noted that this embodiment is made compatible with present PCMCIA cards, by modifying the molded module frame 12 to include female receptacle contacts along the shorter edge of the frame. It is also noted that FIGS. 14, 14A and 14B are not drawn to scale, and sides 20 of the molded frame 12 preferably have the same thickness in FIGS. 14, 14A and 14B, although this is not required.

Figure 16:
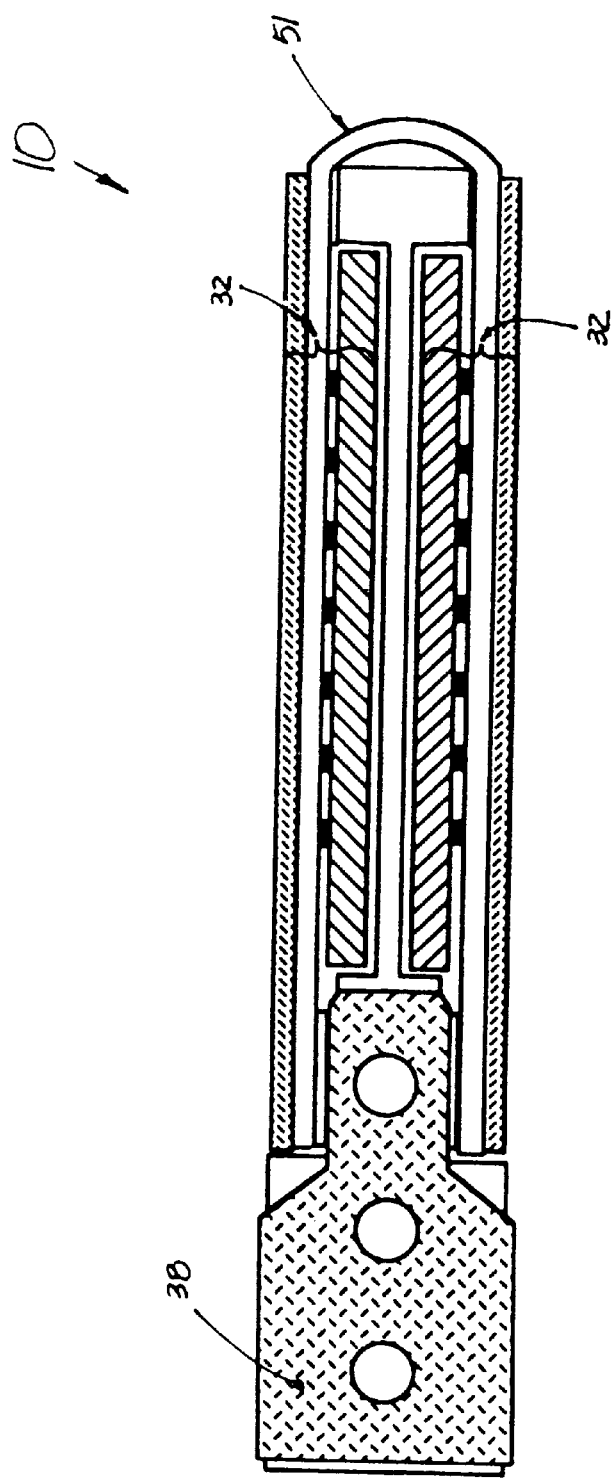
FIG. 16 is similar to FIG. 15A, and illustrates how a crossover electrical path between the thin laminate circuits can be established using a folded section of flexible thin laminate circuit.

Referring now to FIGS. 15, 15A, and 16, alternate views of the semiconductor module illustrated in FIGS. 14 and 14A are shown. FIG. 15 is a cross-sectional view of an embodiment of the molded frame shown in FIG. 6 and is similar to the module view shown in FIGS. 14 and 14A except that the subassembly in FIGS. 15 and 15A are in a final assembled configuration. The cross-sectional view illustrated in FIG. 15 emphasizes the plastic portion of the molded frame 12 and the stamped or etched metal contact 38 is substantially hidden FIG. 15A is a cross-sectional view emphasizing the metal contact 38 portion of the molded module frame 12. FIG. 15 A also illustrates an additional interconnection 78 at the stepped ledge or edge of the molded frame 12 opposite the contact 38 end enabling a cross-over electrical path between the laminate circuits 50 across the stepped ledge or edge. FIG. 16 is similar to the view illustrated in FIG. 15A except that a single flexible laminate circuit 50 that is folded at one end 51 is substituted for the two laminate circuits 50 and interconnection 78 of FIG. 15A.

Figure 20:
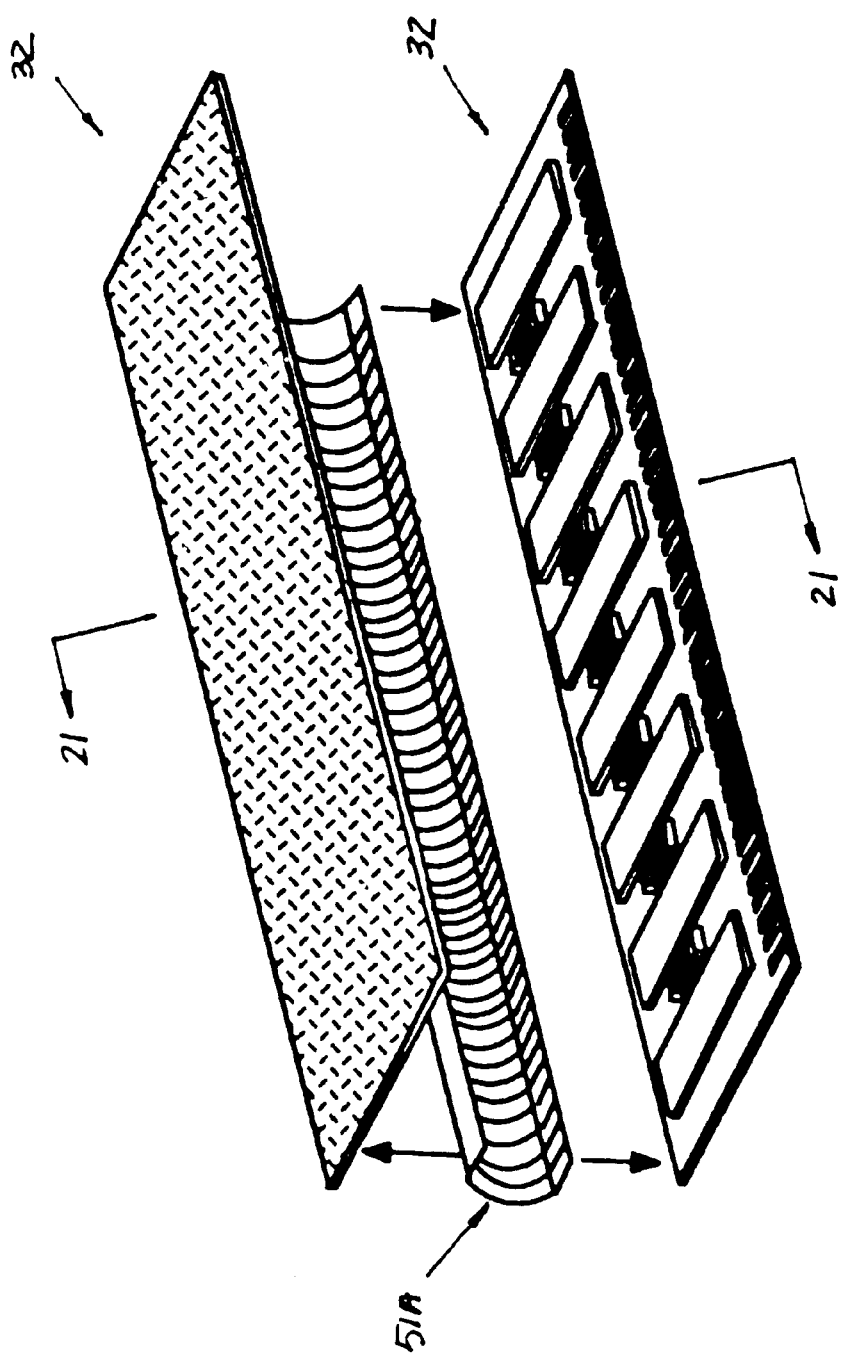
FIG. 20 is an exploded view of an alternate embodiment of FIG. 16 in which crossover of the electrical paths between opposing subassemblies is provided by a separate piece of flexible laminate circuit joined along the edge.
Figure 21:
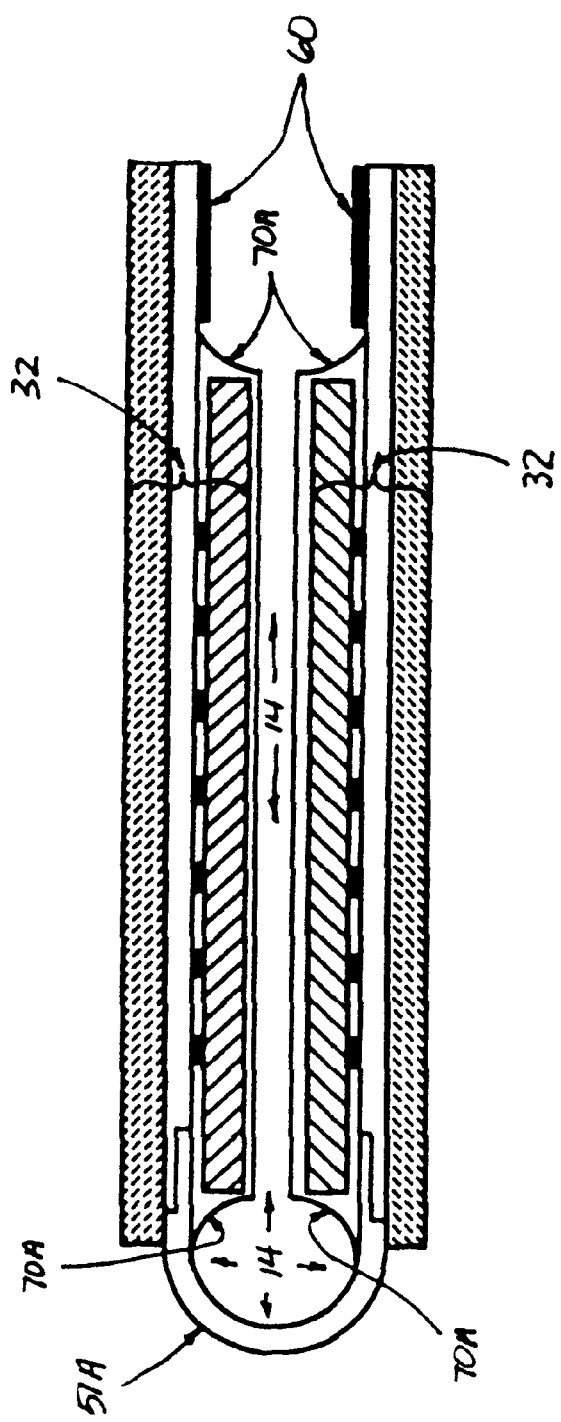
FIG. 21 is a cross-sectional view of FIG. 20, after the separate pieces have been joined, showing the spatial relationship of the opposing subassemblies folded towards each other.

Therefore, in summary, in embodiments where two or more composite semiconductor substrate subassemblies 32 are attached to the molded frame 12, as shown in FIGS. 13–16 the floor 28 can oe reduced in thickness and repositioned along the center-line axis to increase the available spacing between mounted devices and components. Substrate-to-substrate electrical interconnect is normally provided via electrical shunting 21 of the contact pads 22 across the bottom edge 20 of the molded frame 12 as previously described in FIG. 5, or through stamped or etched metal contacts 37, 38, or 39. However, additional interconnections can be facilitated around the entire perimeter of the internal stepped ledge 30 or edge of molded frame 12 opposite contacts 22 or 22' (i.e. top edge or side of frame), through metal contacts 78 as illustrated in FIG. 15A, or through a single continuous flexible thin laminate circuit 50 folded over at the top 51 of the module as illustrated in FIG. 16 (refer also to FIGS. 18B–D, and 20–30). Flexible thin laminate circuit can also be attached as a separate piece 51A to subassemblies 32 as illustrated in FIGS. 20 and 21, or can be folded over and around the bottom edge 53 of the module as illustrated in FIGS. 18A and 25B–28A or as discussed below.

Module Removably Connected to a Module Frame Socket

Figure 19:
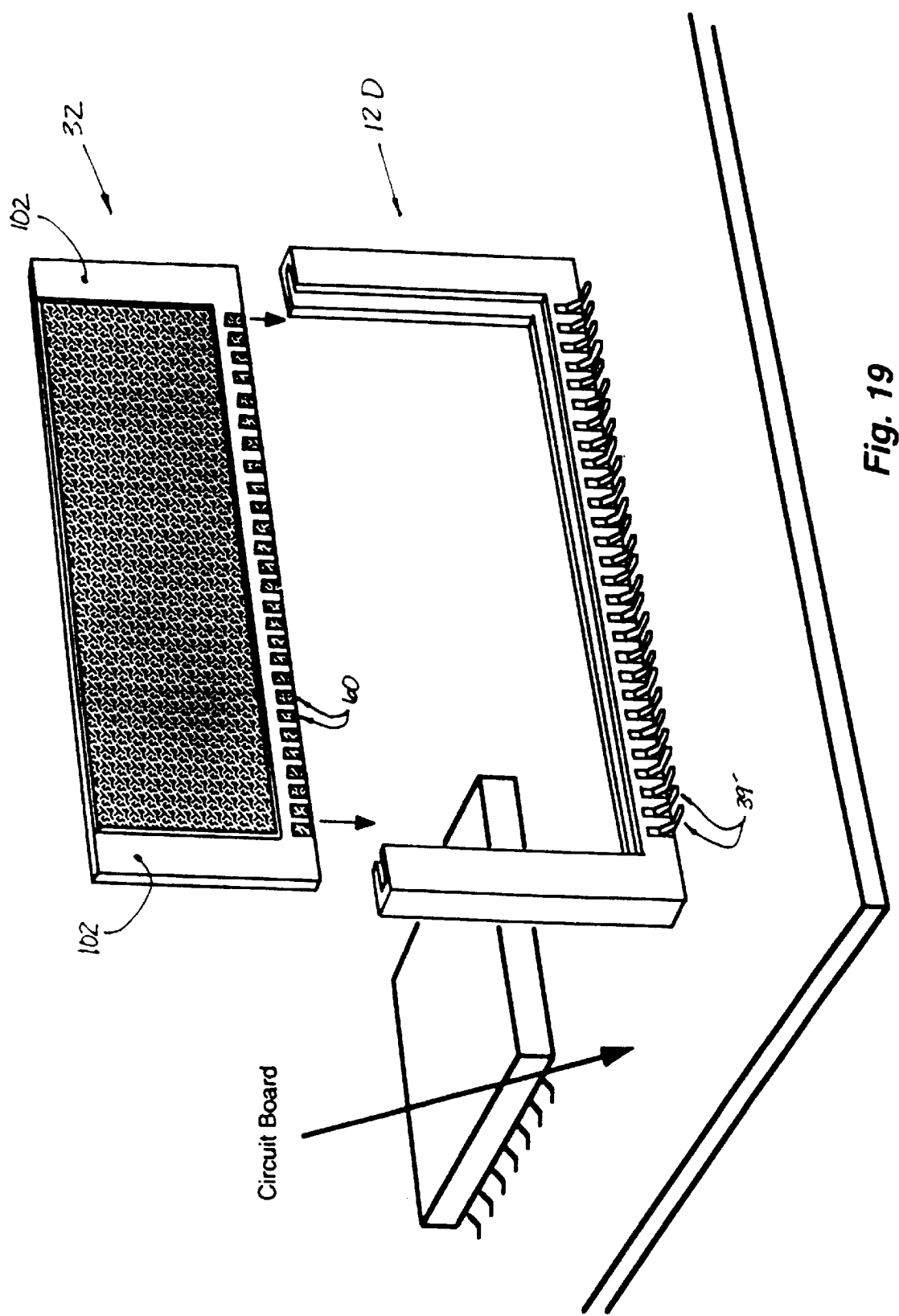
FIG. 19 illustrates an example of how the overcoated subassemblies of FIGS. 17–18 may be mated to a module frame socket premounted on a circuit board.

In the above embodiments including variants employing multiple semiconductor substrate subassemblies 32, the module includes a permanently attached molded frame 12 having a single internal cavity 14 or two internal cavities separated by a floor 28 as described above. Semiconductor devices 54 are mounted to the respective subassembly(s) and are received in the respective cavities, preferably not contacting the floor of the respective cavities except as illustrated and discussed with respect to FIG. 14B. In other embodiments, such as overcoated embodiments discussed below with reference to FIGS. 17, and 18A–D, and FIGS. 21–30, the module does not include a permanently attached molded frame as part of the module itself, but rather is adapted for insertion into a module frame socket, which essentially behaves as the molded module frame, i.e. the module frame socket establishes electrical and/or optical and mechanical connection to the subassembly(s) and adds rigidity to the module. As shown in FIG. 19, the module frame socket 12D is permanently attached to the main circuit board instead of the subassembly 32 and provides mechanical and electrical connection between the removable subassemblies and the main circuit board.

Overcoated Embodiments

Figure 17:
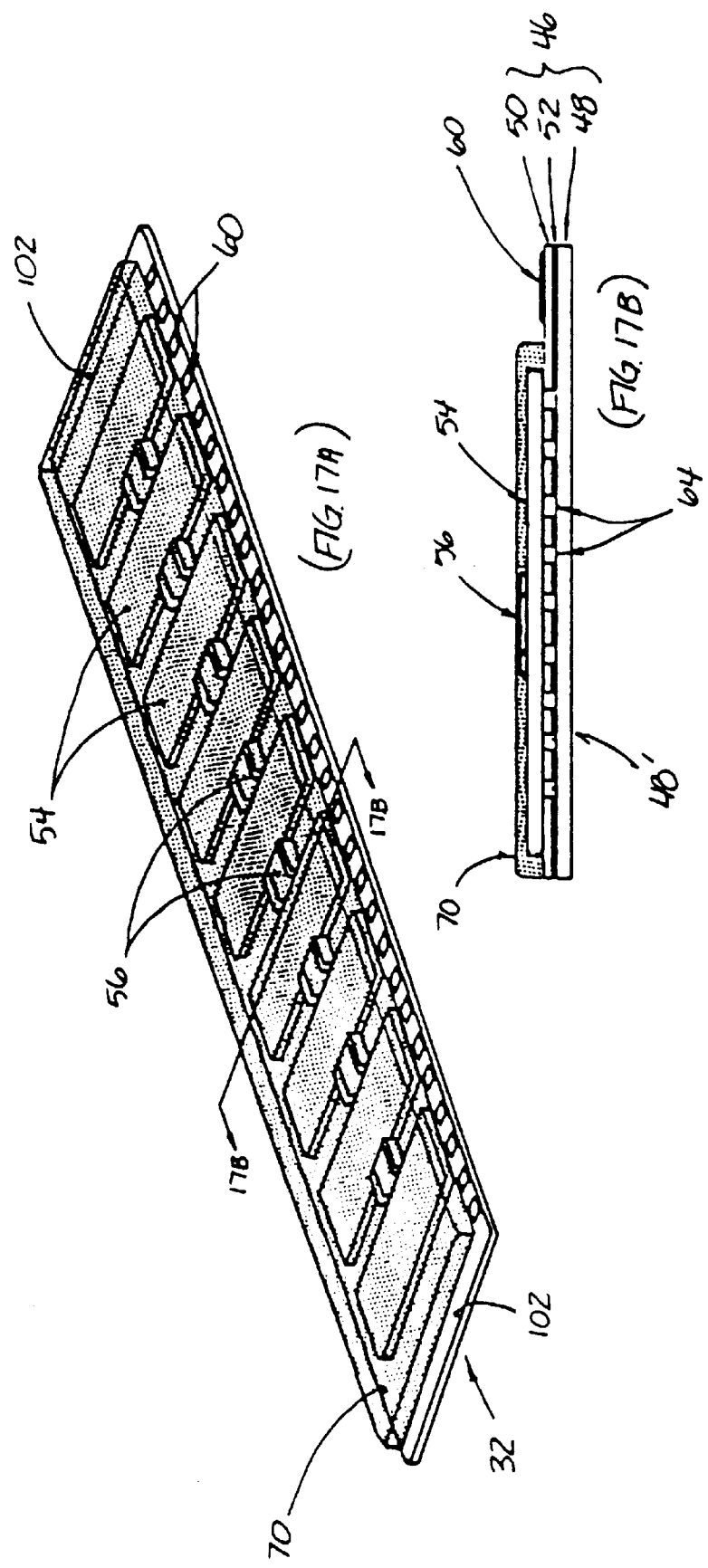
FIGS. 17A–17B illustrate an alternate embodiment of the present invention comprising an overcoated composite semiconductor substrate subassembly (hereinafter referred to as an overcoated subassembly)

In yet another embodiment of the present invention, subassembly 32 is assembled independently of the molded frame 12 by applying or molding a protective overcoat 70, as shown in FIG. 17. As shown in FIGS. 17A–B, the subassembly comprises a composite substrate 46 preferably including cover plate 48 and thin laminate circuit 50 that is bonded to the cover plate 48 by film adhesive 52. A plurality of semiconductor devices 54 and passive components 56 are mounted on the laminate circuit 50. The protective overcoat 70 comprises an epoxy resin, thermal plastic encapsulant or similar mold compound or plastic laminate film and covers the semiconductor devices 54, passive components 56 and substantial surface of the thin laminate circuit 50, while leaving substrate pads 60, end surfaces 102 (optional) and external surface 48' of the cover plate 48 exposed. As illustrated in FIG. 19, the resultant subassembly 32 can then be mated to an appropriate molded module frame socket 12D with slots to receive the end surfaces 102, or combined with a plurality of leads 40 or 40' (FIG. 9) for direct mounting to a main circuit board. Alternatively, subassembly 32 could be completely encapsulated by the protective overcoat 70 leaving leads 40 or 40' protruding from the edge. Other overcoated embodiments are discussed below.

Double-Sided Subassembly

Each of the aforementioned subassemblies 32 use only one of two available surfaces of cover plate 48 to attach the thin laminate circuit 50 and devices 54. Turning now to FIGS. 18A–18D, additional embodiments of the module shown in FIG. 17 are illustrated in which additional semiconductor devices 54 and other components 56 are attached to the external surface 48' (FIG. 17B) of the cover plate 48. In these embodiments, an additional or second thin laminate circuit 50 is applied to at least a portion of the external surface 48' of the cover plate 48, and a second plurality of semiconductor device 54 and passive components 56 are mounted to either the second laminate circuit 50 or directly to the cover plate 48. A protective overcoat 70 is applied or molded to the surface 48'. In this embodiment, protective overcoat 70 functions in part as the molded frame providing rigidity to the module. The protective overcoat 70 also serves to encapsulate this second side of subassembly 32. In one sense, the protective overcoat molds around the subassembly, thereby essentially creating a "cavity" around the subassembly 32. The cover plate 48 no longer functions as a cover but continues to function as a thermal conductor while also acting as a rigid mounting surface for semiconductor devices 54 and components 56. Thin laminate circuits 50 on either surface of cover plate 48 can be either physically separate and, therefore, electrically independent, or physically and electrically joined along the edge(s) of cover plate 48 as a single flexible circuit folded over and around said edge(s). In these examples, the module preferably appears symmetrical with respect to a centerline drawn end-to-end through cover plate 48, as viewed in FIGS. 18A–18D. Other applications make use of a flexible circuit folded over and around the edge(s) of cover plate 48 and extending only part way onto surface 48', to provide an additional row or rows of substrate pads 60 as illustrated in FIGS. 25B, 26–28.

FIGS. 18A and 18B comprise the cover plate 48 and semiconductor devices 54 which are mounted on either side of the cover plate 48, as shown. The semiconductor devices 54 are preferably mounted to laminate circuits 50 which are applied to opposite sides of the cover plate 48. In FIG. 18A, flexible circuit 50 is applied, preferably as a single sheet, folded over and around the bottom edge of cover plate 48 at one end, as shown at 53 and extending to the edges of the other end. FIG. 18B illustrates the flexible circuit 50 folded over and around the opposite or top end of the cover plate 48, as shown at 51. In FIGS. 18A and 18B, the flexible circuit 50 and adhesive film 52 have one or more open windows 62 through the flex circuit and adhesive film 52 similar to that illustrated in FIG. 4. The semiconductor devices 54 are preferably mounted in the windows of the flexible circuit. It is noted that the flexible circuit 50 surrounds the semiconductor devices 54, although this is not illustrated in FIGS. 18A–B due to the cross-sectional view. In other words, a different cross-sectional view taken through a part of the module between the semiconductor devices 54 would show a single continuous thin laminate circuit 50 beginning at an edge on a first side at a first end and extending across the first side, folded over the second end and extending across the second side returning to the first end.

In FIGS. 18A and 18B, substrate pads 60 and bonding pads 76 are mounted on either side of the outside surface of the flexible circuit 50. The bonding pads 76 connect to the semiconductor device bond pads 74 with conventional wire bonds 73, as shown. The bonding pads 76 are in turn electrically connected to other bonding pads 76, or substrate pads 60, through conductive lines and traces routed across the surface or internal laminate layers of circuit 50. In FIG. 18A, conductive traces are also routed across the folded end 53 of flexible circuit 50 to provide electrical connection between other substrate pads 60 on the opposite surface. In FIG. 18B, electrical connection between the substrate pads 60 are provided through an electrical trace(s) at folded end 51. However, this requires a long signal path routed over and across the top end of the module and back down the opposite side. In one embodiment, a conventional epoxy-glass PCB (not shown) is substituted for the flexible circuit 50 and cover plate 48, and electrical connections between contact pads 60 are achieved using plated via holes passing through the circuit board thickness. A protective overcoat 70, preferably comprised of a thermal plastic encapsulant, encases the semiconductor devices on both sides of cover plate 48 in FIGS. 18A and 18B.

In FIGS. 18C and 18D, the module comprises the cover plate 48 with the flexible circuit 50 substantially surrounding the cover plate 48, as shown. The semiconductor devices 54 mount on either side of the flexible circuit 50. In FIG. 18C, thermal vias 64 are positioned in the flexible circuit 50 between the cover plate 48 and the semiconductor devices 54 and provide thermal conduction of the heat generated by the semiconductor devices 54 to the cover plate 48. It is noted in FIG. 18C that thermal vias 64 are provided instead of open windows 62 in this embodiment and that semiconductor devices 54 sit atop flexible circuit 50. In FIGS. 18C and 18D, flexible circuit 50 is applied as in FIG. 18B, i.e., folded over and around the top end of the module. FIG. 18D illustrates an embodiment in which a thin rectangular battery is substituted for cover plate 48, as previously discussed with reference to FIG. 3. Also in FIG. 18D, bondpads 74 of the semiconductor devices 54 are attached to the bond pads 76 of the flexible circuit 50 using Flip Chip Assembly or Direct Chip Attach (DCA), as discussed above.

Folded Subassemblies

Referring now to FIGS. 20–30, alternate embodiments of the present invention are shown. As previously referred to in FIG. 16, and now further illustrated in FIG. 20, these embodiments include a fold over design and do not include a molded module frame as part of the module, but rather are adapted for connection to a module socket similar to that shown in FIG. 19.

1. Protective Overcoat Material

These embodiments also preferably include a protective overcoat 70A to encapsulate the semiconductor devices 54 and components 56 mounted upon composite substrates 46, and thereby protecting them from environmental hazards including atmospheric moisture, surface contamination, or stresses transmitted through the module, and aiding in the overall rigidity of the module. Protective overcoat 70A can consist of the same materials as previously mentioned in reference to the protective overcoat 70 used in FIGS. 17–18D. In these examples, however, the devices 54 and components 56 face inward toward a central cavity 14, similar to FIGS. 1–16, and are substantially protected by cover plates 48. Therefore, less rigid or semi-rigid compounds can be substituted for protective overcoat 70A, which are intended to function more as a cushioning agent to fill the gap or void existing between adjacent subassemblies 32. Examples include elastomeric materials, and other flexible rubber-like compounds that could be injected, molded, or dispensed to encapsulate the devices either before or after the subassemblies are folded together. In some embodiments (FIGS. 22–24, 29A and 31) virtually all of the volumetric void between adjacent subassemblies 32 is filled with protective overcoat 70A. This would typically be accomplished by dispensing overcoat material 70A into the cavity after subassemblies 32 are folded together. In other embodiments (FIGS. 21 and 26–28) cavity 14 is only partially filled with overcoat material 70A, which indicates the overcoat material 70A was molded or applied before subassemblies 32 were folded together. It should be noted, that these Figures are not to scale, and that little or no space may exist for FIGS. 21 and 26–28 in actual usage dependent upon spacing requirements dictated by the module socket into which these modules are inserted.

In addition to improving the overall rigidity and mechanical integrity of the finished assembly, protective overcoat 70A also improves the hermeticity or moisture resistance of the module. Additional manufacturing steps to improve hermeticity at the component or semiconductor device level include special chip surface coatings or undercoatings—depending upon device orientation and application methodology—including, but not limited to organic epoxies (ex. "Praleen™," die undercoating adhesives, etc.), vacuum/plasma deposited ceramic or diamond coatings, moisture immobilizing polyamide and other suitable materials known within the industry.

Referring now to FIG. 21, two subassemblies 32 are illustrated in cross-section joined with a separate piece of folded laminate flex circuit 51A at the end opposite from the substrate pads 60. First and second cover plates 48 connect to the flex circuit 51A. First and second laminate circuits 50 are applied to inner surfaces of the first and second cover plates 48 respectively. First and second pluralities of semiconductor devices mount on the first and second laminate circuits 50, respectively. Semiconductor devices 54 are attached to the surface of laminate circuit 50 by one of several Direct Chip Attached methodologies discussed above. A protective overcoat 70A partially fills the void or cavity 14 enclosed by the opposing subassemblies 32 and folded flex circuit 51A. In this embodiment, the cover plates 48 are discontinuous or separated, but are joined together along one or more edges to each other through the laminate flex circuit 51A, enabling the subassemblies 32 to be folded such that the semiconductor devices are placed in the interior of the module, as illustrated in FIG. 21. In an alternate embodiment of the invention, the subassemblies 32 are reverse folded about the flex circuit 51A such that the semiconductor devices are positioned on the outside surfaces of the respective cover plates 48. This embodiment is similar to FIGS. 18A–D except that in this embodiment the first and second pluralities of devices 54 are mounted to first and second cover plates 48, whereas in FIGS. 18A–D the first and second pluralities of semiconductor devices 54 are mounted on opposites sides of the same cover plate 48. Although any included angle between these two extreme configurations can be used for the practice of this invention, the preferred orientation is as represented in FIG. 21 for advantages as previously discussed.

2. Module Frame Socket

Figure 22:
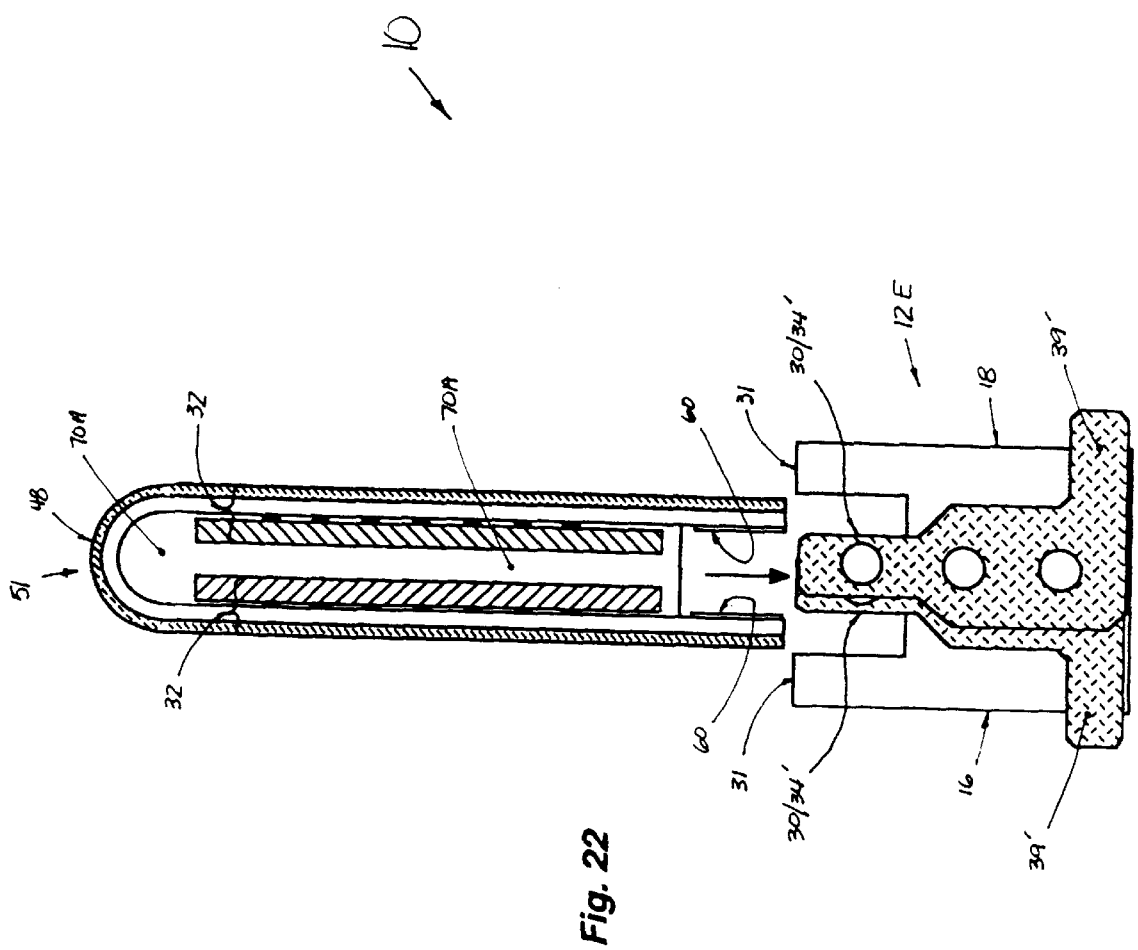
FIG. 22 is a cross-sectional view of yet another embodiment of FIG. 21 in which the volumetric void between adjacent subassemblies has been filled with a semi-rigid compound. [The resultant rigid assembly is shown superimposed above a cross-sectional view of a module frame socket similar to that shown in FIGS. 19, 29 or 30]

Referring now to FIG. 22, an alternate embodiment of FIG. 21 is shown in cross-section, poised above a molded module frame socket 12E configured as a receptacle to receive the bottom edges of subassemblies 32. In this embodiment and those represented in the following FIGS. 23–30, as with FIGS. 17, 18A–D, 20, and 21, subassemblies 32 are semi-permanently attached (i.e. removable) to a module frame socket (12D–K), being held in place by some form or combination of pressure/friction fit, pinching, wedging or spring action pressure exerted between contact pads 34/34' of the module frame socket and composite substrate pads 60, or secured by molded features or structures residing on the molded frame of the module socket. Some of these structures may be moveable by means such as a rotating or sliding cam action or sliding wedge or lever-actuated clamping motion or heat/voltage actuated bi-metal device effecting a clamping or pinching action to allow subassembly(s) 32 to be more readily engaged or disengaged from its module frame socket 12. These moveable structures would effectively reduce or eliminate the pressure exerted between contacts 34/34' of the module frame socket and contacts 60 of subassembly(s) 32 when mating or un-mating these parts.

Referring again to FIG. 22, subassemblies 32 are joined with a continuous layer of flex laminate circuit 50 folded over at the top 51, and backed with a continuous layer of cover plate 48. In this instance, cover plate 48 is presumed to be composed of malleable or ductile material thin enough to enable folding of the material without breakage. The interior cavity in this example is substantially filled (i.e. most of the cavity is filled) with a protective overcoat material 70A. Module frame socket 12E, also shown in cross section, is depicted with stamped metal contacts 39' similar to those previously discussed in FIG. 8. It is noted that this view of module socket 12E is a cross-sectional view, and that module socket 12E appears substantially the same as the sockets illustrated in FIGS. 19 and 29.

FIG. 23 is another embodiment of a module similar to that shown in FIG. 21, with exception that subassemblies 32 are joined with a continuous layer of flex circuit 50, and the interior cavity is substantially filled with protective overcoat material 70A like FIG. 22. In an alternate embodiment (not shown) of FIG. 21 or 23, contact pads 60 can be formed across the outside surface of folded thin laminate circuit at 51 or 51A for engagement with a module frame socket similar to 12F illustrated in FIG. 26. In this instance the module would be mounted upside down with respect to other embodiments detailed in FIGS. 22–30. In yet another embodiment of FIG. 21 (not shown), thin laminate circuit 50 may extend beyond the edges of the composite substrate, such that contact pads 60 are not supported by the cover plate 48, but are part of a flexible circuit that can be flexibly positioned at a variety of angles for interfacing with an appropriate module socket or for direct placement against the main circuit board.

FIG. 24 is yet another embodiment of a module similar to that shown in FIG. 22, with exception that the laminate flex circuit 50 has window openings 62, similar to those represented in FIG. 4 and the semiconductor devices 54 are positioned in the window openings. These window openings 62 enable the semiconductor devices 54 to be attached directly to the cover plate 48 for optimum thermal dissipation or conduction. Semiconductor devices 54 are connected to the laminate flex circuit 50 by wire bonds 73.

FIG. 25 is a top view looking down on a module similar to FIG. 23 as it would appear prior to being folded and/or encapsulated with protective overcoat material 70A. Line B–B' represents the fold axis as viewed from above. FIG. 25A is a cross-section view taken from FIG. 25 at the location represented by the arrows. FIG. 25B is another embodiment of FIG. 25A, in which the laminate flex circuit 50 is folded over and around the bottom edges 53 to provide another set of substrate pads 60 on the opposite side 48' of cover plate 48 similar to those represented in FIG. 18A.

Figure 27:
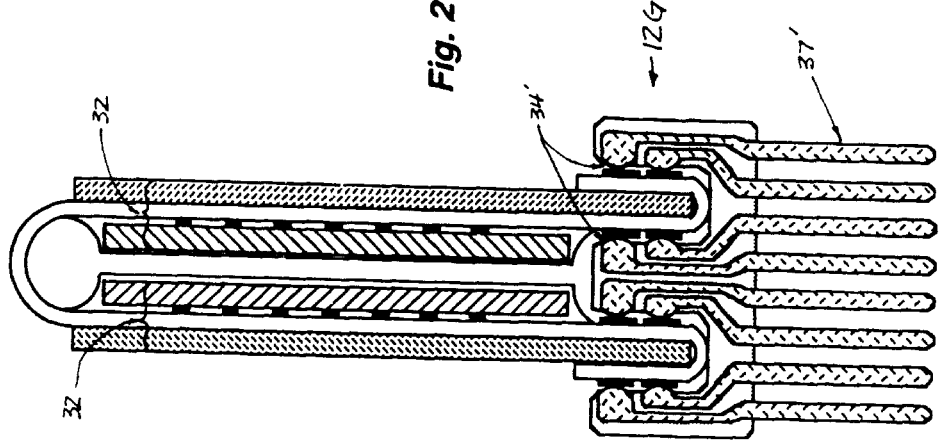
FIG. 27 details in cross-sectional view the embodiment of FIG. 26 in which contacts along the edges of opposite and opposing subassemblies are mated to a module frame socket exhibiting multiple independent contacts.
Figure 26:
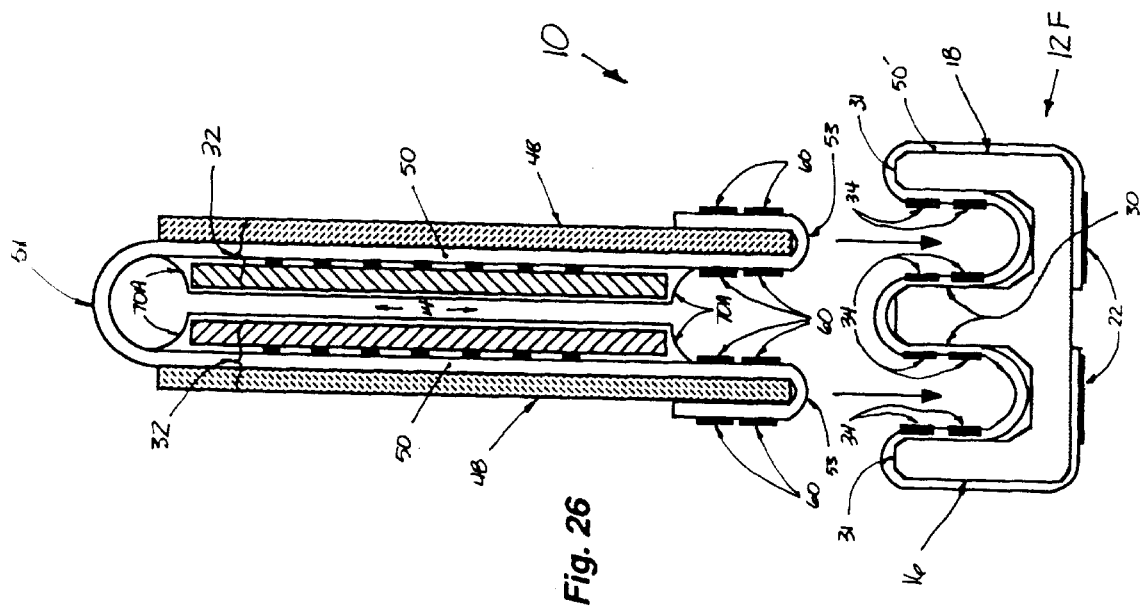
FIG. 26 is a cross-sectional view of an embodiment of FIG. 25B in which multiple rows of contacts are provided by a single flexible circuit folded over and around the edges of opposing subassemblies. [The resultant assembly is shown superimposed above a cross-sectional view of a module frame socket that is wrapped with a corresponding flexible laminate circuit]
Figure 28A:
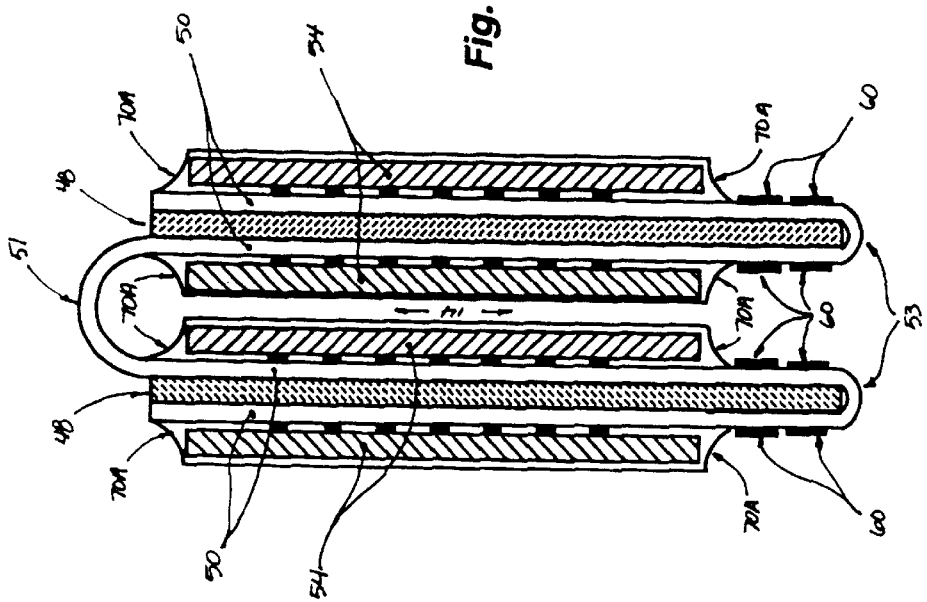
FIG. 28A is a cross-sectional view of a module that has semiconductor devices mounted on all four surfaces of the subassemblies.
Figure 28:
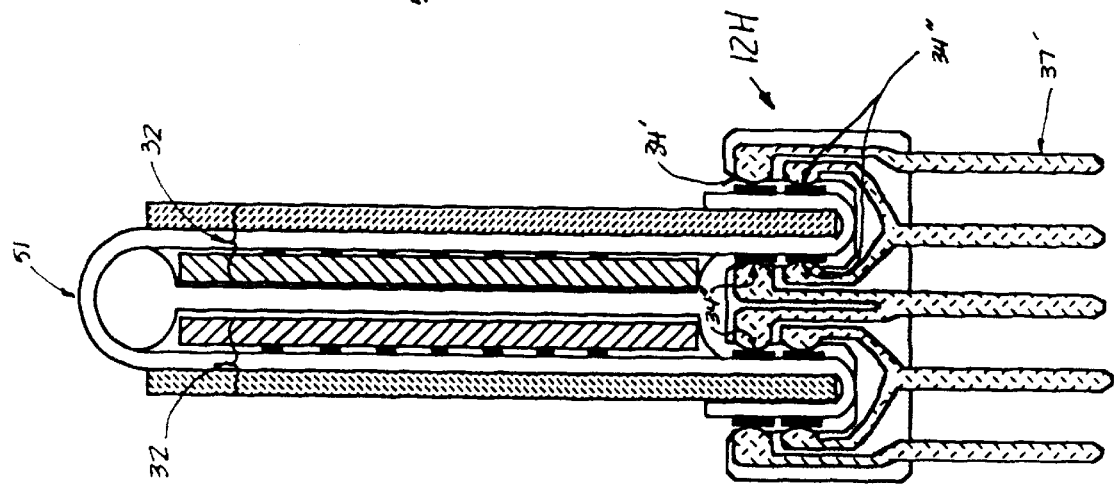
FIG. 28 details in cross-sectional view the embodiment of FIG. 26 in which contacts along the edges of opposing subassemblies are mated to a module frame socket exhibiting independent and bifurcated or redundant contacts.

The modules represented in FIGS. 26, 27 and 28 are similar to one another, and are cross-section views of yet another embodiment resembling FIG. 25B, with exception that multiple rows of substrate pads 60 are depicted on both sides of the bottom ends of subassemblies 32. These figures also illustrate several alternative types of module frame sockets that can be adapted to the module. For example, as shown in FIG. 26, a cross-sectional view of an embodiment of FIG. 25B is shown in which multiple rows of contacts 60 are provided by a single continuous thin flexible laminate circuit 50 folded over at the top 51 and around the edges 53 of opposing subassemblies 32. The resultant assembly is shown superimposed above a cross-sectional view of a module frame socket 12F that is wrapped with a corresponding flexible laminate circuit 50'. As shown in FIG. 27, a cross-sectional view details the embodiment of FIG. 26 in which contacts 60 along the edges of opposite and opposing subassemblies 32 are mated to a module frame socket 12G exhibiting multiple independent contacts 34'/37'. As shown in FIG. 28, a cross-sectional view details the embodiment of FIG. 26 in which contacts 60 along the edges of opposing subassemblies 32 are mated to a module frame socket 12H exhibiting independent 34' and bifurcated 34" or redundant contacts. Upon insertion of subassemblies 32 into module frame sockets 12F, 12G, and 12H, these contacts (34, 34', 34") would align with those on subassemblies 32, and establish electrical connection to the main circuit board (not shown).

Referring now to FIG. 28A an alternate embodiment of the module shown in FIG. 26 is illustrated. In this embodiment, the flex circuit is folded three times as in FIG. 26, but extends all the way across respective subassemblies for mounting of additional semiconductor devices. The flex circuit has a principal fold at 51 and is also folded at points 53. As with FIG. 26, multiple rows of contacts are provided at the folds 53 of the single flexible circuit 50. As with FIG. 26, semiconductor devices 54 are mounted to the interior of the module on the flex circuit, as shown. However, in FIG. 28A, additional pluralities of semiconductor devices 54 are mounted on the outside of the respective cover plates on the laminate circuit 50. Therefore, in the embodiment in FIG. 28A, four sets or pluralities of semiconductor devices are mounted to the module. First and second pluralities of semiconductor devices are mounted on the interior of the module to the flex circuit applied to the interior of the respective cover plates 48. Third and fourth pluralities of semiconductor devices are mounted to the flexible circuit 50 which is applied to the exterior surfaces of the cover plates 48. A protective overcoat 70A is applied over each of the four pluralities of semiconductor devices as shown.

FIG. 29 is a perspective view of the module previously depicted in FIG. 23, showing how it would slide over and straddle stepped ledges 30 of module frame socket 12I, until seated near the bottom edge of frame 12I, as illustrated in cross-section 29A. In this example, module frame socket 12I is permanently attached to the main circuit board and subassemblies 32 are temporarily attached or inserted (i.e. removable as required) on to frame socket 12I.

FIG. 29B is a cross section view of another alternate embodiment of FIG. 29A in which a 'z-axis' conductive elastomeric material 81 is the principle means for establishing electrical contact between the main circuit board (not shown) and contact pads 60 of the subassemblies through module frame socket 12J.

Figure 6:
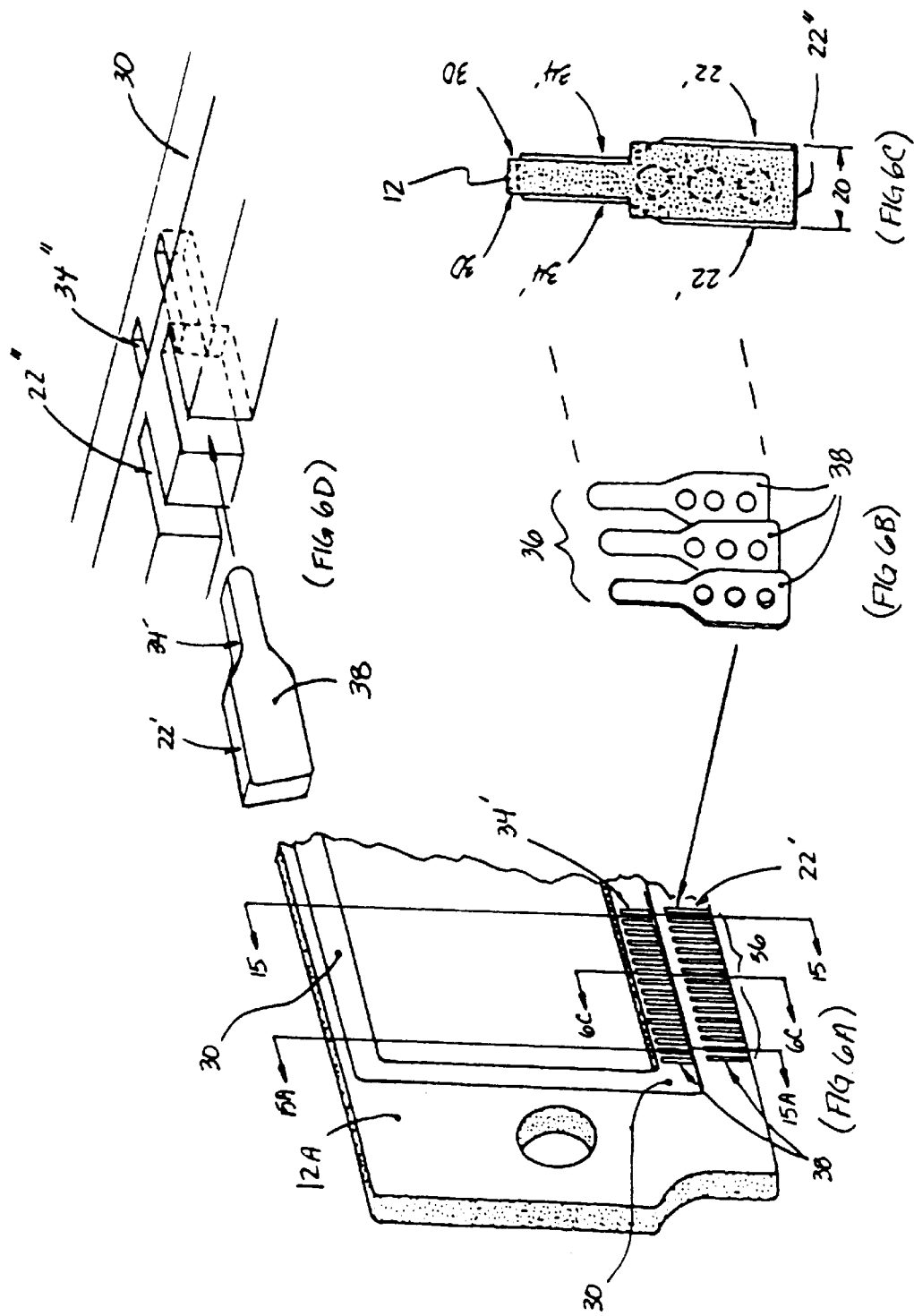
FIGS. 6A–6D illustrate an alternate embodiment of individual contact elements employed in the multichip module of the present invention.
Figure 7:
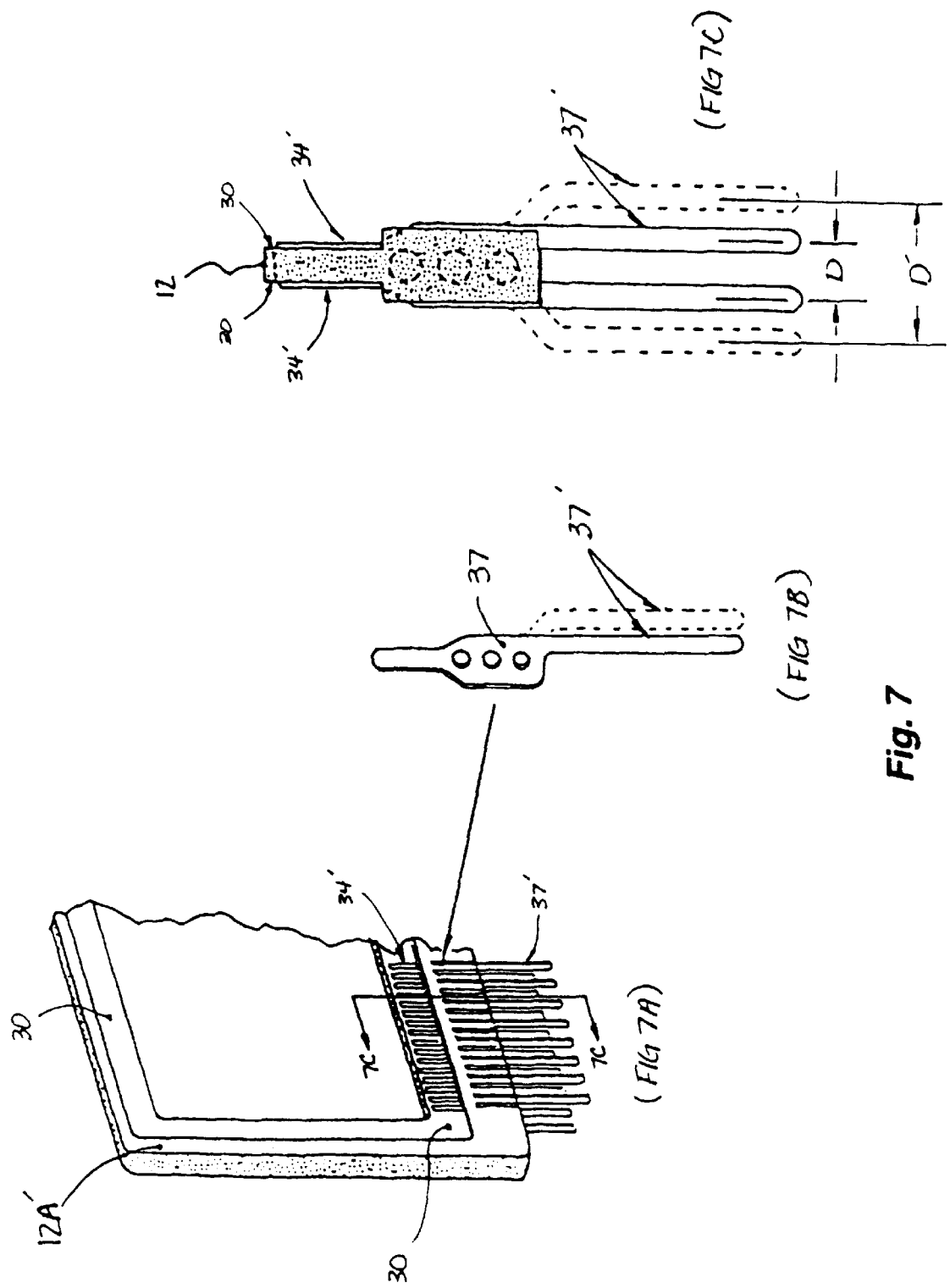
FIGS. 7A–7C illustrate another alternate embodiment of individual contact elements employed in the multichip module of the present invention.
Figure 8:
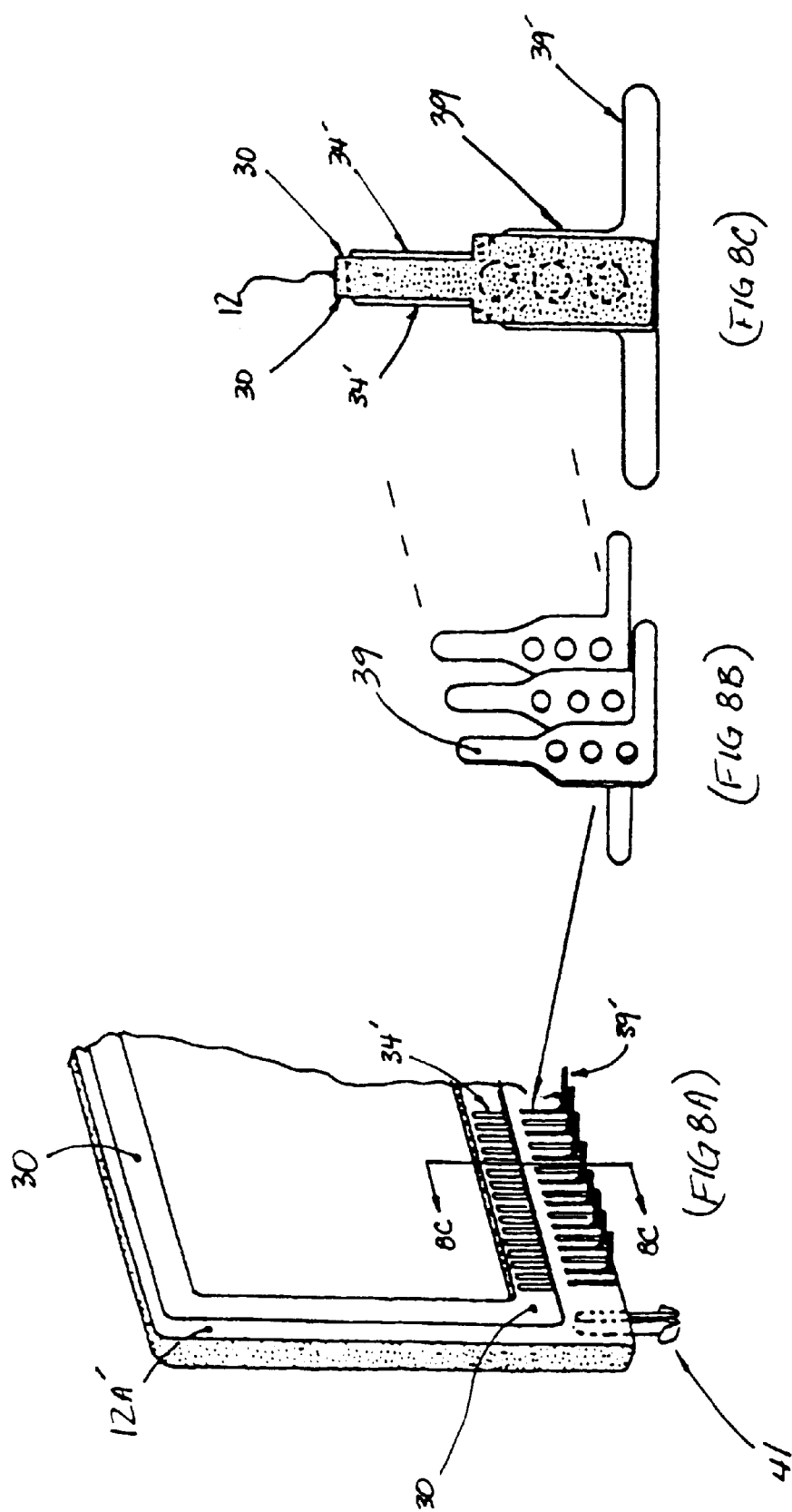
FIGS. 8A–8C illustrate yet another alternate embodiment of individual contact elements employed in the multichip module of the present invention.

FIG. 30 is another perspective view of an embodiment similar to FIG. 29, with exception that contacts along the bottom edge of molded frame 12K are equivalent to those previously discussed in FIGS. 6, and 15–16.

Conclusion

The improved multichip module of the present invention offers numerous advantages over the prior art. For example, the present invention provides a significant decrease in cross-sectional thickness and overall weight reduction for the module as a whole, thereby improving the total net packing density and making the module more appealing for light-weight, thin, portable, hand-held applications. As previously discussed, since this invention is approximately one-third of the thickness of a standard SOJ-type SIMM, it is feasible to mount two or three times more component modules within a specified area of the circuit board as compared to the prior art (FIG. 1A). The present invention provides for mechanical protection of fragile bare silicon devices by enclosing these devices inside a light-safe module, leaving no exposed components. The exterior surfaces, therefore, are free of all obstructions which may become damaged during handling or which may inhibit the placement or display of printed information (e.g. manufacturer's name, logo, date code, part number, patent number, bar code, etc.). Modules free of externally mounted components also simplify the design of shipping trays and facilitates robotic handling and placement at the final end-users manufacturing line. Although backward compatible with existing SIMM sockets and therefore directly replaceable with conventional SOJ-type SIMMs, this invention is also capable of mating with newer sockets that will mount the modules closer together. These newer sockets may mount the modules vertically, horizontally, or in a variety of angles relative to the main circuit board, just as present day SIMM sockets. Whichever way the modules are mounted or socketed, a distinct advantage will be realized for these thin multichip modules, when the modules are stacked beside one another like sticks of chewing gum in a package.

Memory devices are the primary semiconductor components supplied on various module types today. But, there is also a growing requirement to modularize other semiconductor components including microprocessors, application specific integrated circuits, telecommunication and other device types. Accordingly, the present invention provides a means for increasing the number of interconnect pins/pads and improve the thermal dissipation characteristics over present day SIMM module technology. Conceivably, an entire computer can be assembled from specialized functions of thin multichip modules, as described herein, into an overall package approximating the size of a pack of cigarettes.

The molded frame 12 employed in the module of the present invention offers yet another improvement over prior art SIMM memory modules which employ conventional printed circuit board (PCB) materials. A majority of SIMM connecting sockets in usage today, require the module thickness to be tightly controlled across the bottom edge contacts, in order for the module to function reliably in the socket. Especially if the module is to be frequently inserted and removed from the socket. Standard lamination processes used in the construction of PCB's, result in large thickness variations which are difficult to control. This variation in SIMM thickness directly effects the contact pad pressure exerted against the socket contacts, and has been identified as a frequent cause of intermittent electrical failures. Current practice requires rigorous inspection procedures, adding to the material costs, in order to prevent the inclusion of "out-of-spec" SIMM substrates into the manufacturing line. Substituting a molded frame for this critical component of the module provides for more consistent dimensional control across the contact pads and eliminates the necessity for 100% inspection.

An additional benefit gained from a molded frame is the ability to mold custom features on the module housing that are presently impractical with laminate PCBs. Examples of potential molded features include special locking mechanisms designed to mate with appropriate structures on the subassembly(s) or mating socket, or finger grips, and keying mechanisms or other hold fasts.

Methods of Constructing Multichip Modules According to the Present Invention

A method for constructing a thin multichip module as shown in FIG. 1 as well as in other embodiments would generally comprise the following steps:

assembling a composite substrate;

mounting semiconductor devices on the composite substrate;

testing the semiconductor devices after said step of mounting; and attaching the composite substrate including said mounted semiconductor devices to a molded frame.

In addition, to the above steps, the method would generally include repairing any semiconductor devices not operating properly after the step of testing and prior to attaching the composite substrate to the molded frame.

A method of constructing a thin multichip module such as that shown in FIG. 1 is as follows:

(a) forming a composite semiconductor substrate subassembly including a thin laminate circuit and a plurality of semiconductor devices in electrical contact with the thin laminate circuit, wherein the substrate subassembly includes a plurality of spaced apart contacts;

(b) forming a module frame having a plurality of spaced apart contacts adapted to electrically communicate the contacts on the subassembly; and (c) attaching the substrate subassembly to the module frame, wherein the module frame adds rigidity to the substrate subassembly.

As noted, the module frame, and particularly the plurality of spaced apart contacts, are preferably adapted for insertion in a SIMM-type module socket. Alternatively, the module can be adapted for insertion into PCMCIA sockets as desired. As shown in FIG. 1, the module frame preferably includes a floor defining a cavity for receiving the substrate subassembly. The step of attaching preferably comprises attaching the substrate subassembly to the module frame such that the semiconductor devices are received in the cavity, and wherein the plurality of semiconductor devices are enclosed in the multichip module. In the preferred embodiment, the semiconductor devices are received in the cavity and preferably do not touch or contact the floor of the cavity. The floor protectively covers the semiconductor devices and protects the semiconductor devices.

The step of attaching preferably includes attaching the substrate subassembly and module frame in juxtaposition to each other using an anisotropic conductive material between the periphery of the module frame and the substrate subassembly.

A second method of forming a thin multichip module comprises the steps of:

(a) forming a preferably rectangular cover member that is rigid and includes heat dissipation properties;

(b) forming a generally rectangular thin laminate circuit having a plurality of electrical contacts;

(c) affixing the thin laminate circuit to the inner side of the rectangular cover member, preferably by use of an adhesive film;

(d) affixing one or more semiconductor devices to one side of the thin laminate circuit to form a composite semiconductor substrate subassembly;

(e) forming a modular frame of generally rectangular cross section having a rectangular cavity to receive the substrate subassembly;

(f) forming a plurality of contacts along at least one edge of the modular frame to make electrical and mechanical contact with the plurality of contacts on the thin laminate circuit of the substrate subassembly;

(g) attaching the substrate subassembly to the module frame so that the contacts of the subassembly and the frame are electrically connected.

As discussed above, the step of forming the module frame preferably includes placing a floor on the lower portion of the module frame. The substrate subassembly is preferably attached to the module frame, and the floor cooperates with the cover on the substrate subassembly to protect the semiconductor device from external electrical and mechanical environment. The floor on the module frame is preferably molded as an integral part of the frame and the cavity is constructed to receive the semiconductor devices.

Yet another method for forming the thin multichip module of FIG. 1 is as follows. As discussed above with regard to FIG. 1, the module in FIG. 1 includes a composite substrate, a plurality of semiconductor devices, a module frame to support and protect the semiconductor devices, and means for attaching the composite substrate to the modular frame. This method comprises the following steps:

(a) forming a generally rectangular module frame having a lower floor forming a cavity adapted for receiving the composite substrate and semiconductor devices with a plurality of spaced apart contacts along at least one edge thereof;

(b) forming the composite substrate by attaching a rectangular cover to a thin laminate circuit, preferably using an adhesive film;

(c) attaching the plurality of semiconductor devices to the thin laminate circuit to form a composite semiconductor substrate subassembly; and (d) attaching the substrate subassembly into the cavity of the module frame, wherein the contacts of the thin laminate circuit are in electrical communication with the contacts of the module frame.

The stern of attaching the substrate subassembly into the cavity preferably includes applying an anisotropic conductive adhesive ring bounding the cavity of the module frame and contacting the edges of the substrate subassembly. The module is preferably designed to be inserted in a standard SIMM socket. However, it is noted that the module may also be adapted for insertion into a PCMCIA socket, as desired.

A more comprehensive and detailed method for forming a thin multichip module as shown in FIG. 1 is as follows. The module includes the following elements:

(a) a rectangular module frame having a cavity therein and a plurality of spaced apart contacts along at least one edge;

(b) a composite semiconductor substrate subassembly comprising a rectangular coverplate having dimensions similar to the cavity and module frame;

(c) a rectangular thin laminate circuit of a rectangular cross section;

(d) an adhesive film for holding the thin laminate circuit adjacent the inner surface of the cover;

(e) a plurality of semiconductor devices of generally rectangular configuration attached electrically and mechanically to the side of the thin laminate circuit; and (f) an anisotropic conductive adhesive ring to connect the substrate assembly interior the cavity of the module frame to provide an encapsulated module with contacts of the frame in electrical cooperation with the contacts on the thin laminate circuit.

The method for forming the module including the elements listed above is described below:

(1) forming a generally rectangular frame of molded material with a lower thin protective cover on its lower edge and a rectangular cavity therein of a predefined cross section in depth;

(2) forming an isotropic conductive adhesive ring around the parameter of the rectangular cavity and in contact with the module frame;

(3) forming a composite substrate of a rectangular cover having an inner surface, a thin laminate circuit board of general rectangular cross section affixed to the inner surface of the cover by adhesive film;

(4) forming a composite semiconductor substrate assembly of the composite substrate of the thin laminate circuit board, adhesive film, and cover with a plurality of semiconductor devices of generally rectangular cross section affixed to the lower side of the thin laminate circuit by means of a direct chip attach; and (5) forming the completed module by placing the substrate subassembly interior of the cavity and affixing the substrate subassembly in the module frame cavity by the isotropic conductive adhesive ring adjacent the parameter of the cavity.

A method of forming a composite semiconductor substrate subassembly for a thin multichip module such as that shown in FIG. 4 preferably comprises the following steps.

(a) forming a rectangular cover plate;

(b) forming a rectangular film adhesive with a plurality of rectangular spaced apart windows therein for cooperation with the cover;

(c) forming a thin laminate circuit of general rectangular configuration having a plurality of rectangular spaced apart windows therein and a plurality of contacts along at least one edge thereof;

(d) attaching the thin laminate circuit to the cover plate, preferably using the film adhesive; and (e) mounting a plurality of semiconductor devices, wherein one or more semiconductor devices are included within each spaced apart window of the thin laminate circuit and the adhesive film, wherein a plurality of leads on the semiconductor devices are placed in electrical contact with the spaced apart contacts of the thin laminate circuit, and wherein the semiconductor devices are in direct heat conducting contact with the cover.

As previously mentioned, the film adhesive is positioned between the cover plate and the thin laminate circuit to bond the thin laminate circuit to the cover plate. Also, the windows in the film adhesive are preferably aligned with the windows in the thin laminate circuit.

A variation of the above method of forming a composite semiconductor substrate subassembly for a thin multichip module is as follows:

(a) forming a rectangular cover plate;
(b) forming a rectangular film adhesive;
(c) forming a thin laminate circuit of general rectangular configuration having a plurality of contacts along at least one edge thereof;
(d) attaching the adhesive film to the thin laminate circuit;
(e) forming one or more rectangular spaced apart windows in the laminate circuit and adhesive film after said step of attaching the adhesive film to the laminate circuit;
(f) mounting a plurality of semiconductor devices to the cover plate in respective spaced apart windows of the thin laminate circuit and the adhesive film, wherein a plurality of leads on the semiconductor devices are placed in electrical contact with the spaced apart contacts of the thin laminate circuit, and wherein the semiconductor devices are in direct heat conducting contact with the cover.

Yet another variation of the above method is as follows. This method maximizes the dissipation of heat of the semiconductor devices comprised in the subassembly. This method comprises:
(a) attaching a thin laminate circuit board with a plurality of spaced apart rectangular apertures therein to a cover for the multichip module by adhesive film having a series of rectangular apertures in direct registration of those of the thin laminate circuit; and
(b) attaching a plurality of semiconductor devices to the thin laminate circuit in registration with the rectangular openings therein whereby the semiconductor devices are in direct terminal contact with the cover as a heat sink for the semiconductor devices.

A process for forming a dense thin multichip module comprises the steps of:
(a) forming a generally rectangular frame including a floor defining first and second cavities in opposite sides of said floor and a plurality of contacts in spaced apart relation along at least one of the edges thereof;
(b) forming a pair of composite semiconductor substrate assemblies comprising a protective, thermally conductive cover, a thin laminate circuit affixed to a surface of the cover, and a plurality of semiconductor devices attached to the surface of the thin laminate circuit;
(c) attaching the first substrate subassembly into the first cavity; and
(d) attaching the second substrate subassembly in the second cavity.

In this method, the floor separates the two substrate subassemblies and provides mechanical rigidity to the multichip module frame. Also, a step of attaching a flexible circuit to the first and second thin laminate circuits can be included.

Another method of forming a thin multichip module comprises the steps of:
forming a generally rectangular flat frame with a floor having an upper and lower surface wherein the floor comprises the interior of the frame defining an upper and lower cavity;
placing first and second laminate circuits on said upper and lower surfaces of said floor;
placing first and second pluralities of semiconductor devices along the upper and lower surfaces of the floor;
attaching first and second cover members on said upper and lower surfaces of said frame to protect said first and second pluralities of semiconductor devices from external environmental conditions.

A method of forming a thin multichip module such as that shown in FIG. 17 is as follows. As previously discussed, the module illustrated in FIG. 17 includes a thin laminate circuit adhesively attached to a cover plate, and a plurality of semiconductor devices electrically and mechanically connected to the thin laminate circuit in operative relation. This method comprises the steps of:
(a) affixing a thin laminate circuit to a generally rectangular cover;
(b) attaching a plurality of semiconductor devices to the thin laminate circuit in electrical contact therewith; and
(c) applying a protective coat covering at least a portion of the semiconductor devices, wherein the protective coat provides rigidity to the composite semiconductor substrate subassembly.

In this method, the step of applying comprises applying the protective coat between the laminate circuit and the semiconductor devices. The step of attaching preferably comprises attaching the plurality of semiconductor devices to the thin laminate circuit using an anisotropic electrically conducting adhesive material.

One embodiment of a method for forming a multichip module such as that shown in FIGS. 18A–B comprises the steps:
forming a cover plate having first and second surfaces;
applying first and second laminate circuits on the first and second surfaces of the cover plate; and
applying first and second pluralities of semiconductor devices to said first and second laminate circuits.

A method of forming a thin multichip module such as that shown in FIG. 22 comprises the following steps.
(a) forming a generally rectangular thin laminate circuit;
(b) placing one or more electrical contacts into the thin laminate circuit, said one or more electrical contacts for mating to a connector frame socket on a circuit board;
(c) affixing the thin laminate circuit to a generally rectangular shaped cover member;
(d) attaching a plurality of semiconductor devices to the thin laminate circuit; and
(e) folding the thin laminate circuit and cover member along its center line to provide a U-shaped module wherein one end of the module includes said one or more electrical contacts and said end is adapted for mating with the connector frame socket.

In order to construct the module shown in FIG. 24, the thin laminate circuit is made to include a plurality of windows. The step of attaching preferably comprises attaching the plurality of semiconductor devices through respective windows in the thin laminate circuit to the cover member.

A second method of forming a thin multichip module as shown in FIG. 22 comprising the steps of:
(a) forming a generally rectangular printed circuit board, said printed circuit board including one or more electrical contacts for mating to a connector frame socket on a circuit board;
(b) attaching a plurality of semiconductor devices to the printed circuit board; and
(c) folding the printed circuit board along its center line to provide a U-shaped semiconductor substrate subassembly wherein one end of the substrate subassembly is adapted for mating with the connector frame socket.

Yet another method of forming a thin multichip module such as that shown in FIG. 22 comprises the following steps:
(a) forming a generally rectangular thin laminate circuit having first and second ends, said thin laminate circuit including one or more electrical contacts for mating to a connector frame socket on a circuit board;

(b) affixing the thin laminate circuit to a generally rectangular shaped cover member;

(c) attaching a plurality of semiconductor devices to the thin laminate circuit; and (d) folding the thin laminate circuit along its center line to provide a U-shaped wherein one end of the module includes said one or more electrical contacts and said end is adapted for mating with the connector frame socket.

In the above method, the U-shaped module preferably includes a first folded end and a second end. The second end is adapted for mating with the connector frame socket. Also, a protective overcoat can be applied over the plurality of semiconductor device after said step of attaching said plurality of semiconductor devices.

Another process for forming a thin multichip module comprises the following steps:

(a) providing a generally rectangular shaped cover;

(b) folding a rectangular shaped thin laminate board around the cover and affixing to each side of the cover;

(c) attaching a plurality of semiconductor devices to both sides of the laminate circuit board in mechanical and electrical connection therewith; and (d) placing a protective overlay on the semiconductor devices and laminate circuit board.

Mass Production

Figure 31:
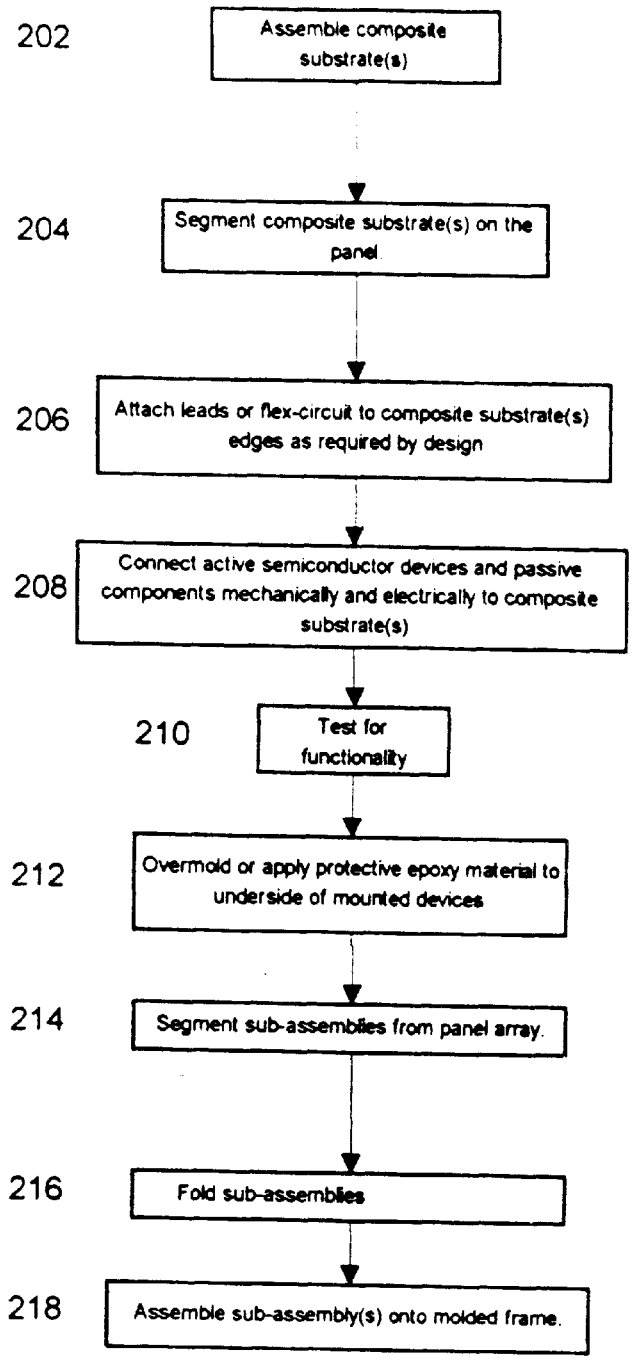
FIG. 31 is a flowchart diagram illustrating a method for assembling the thin multichip module according to various embodiments of the present invention.
Figure 32:
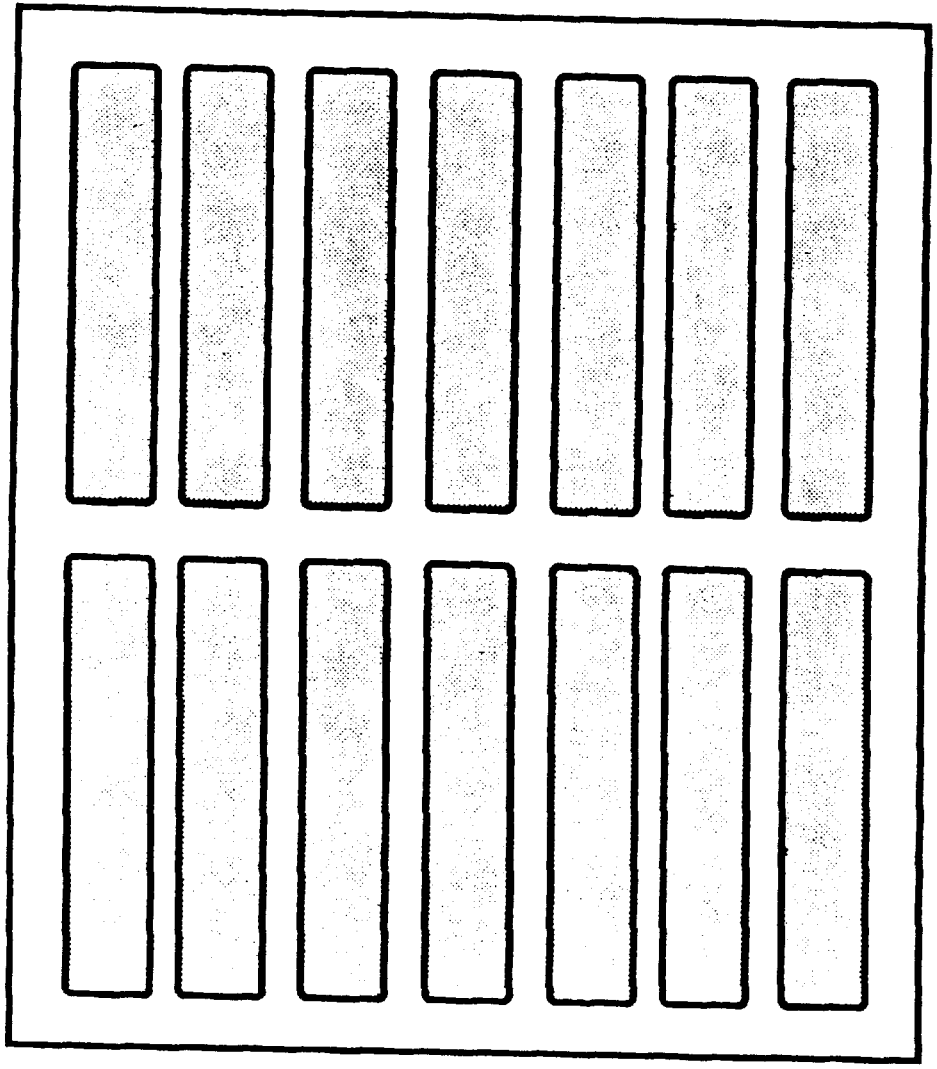
FIG. 32 illustrates a composite substrate panel.
Figure 33:
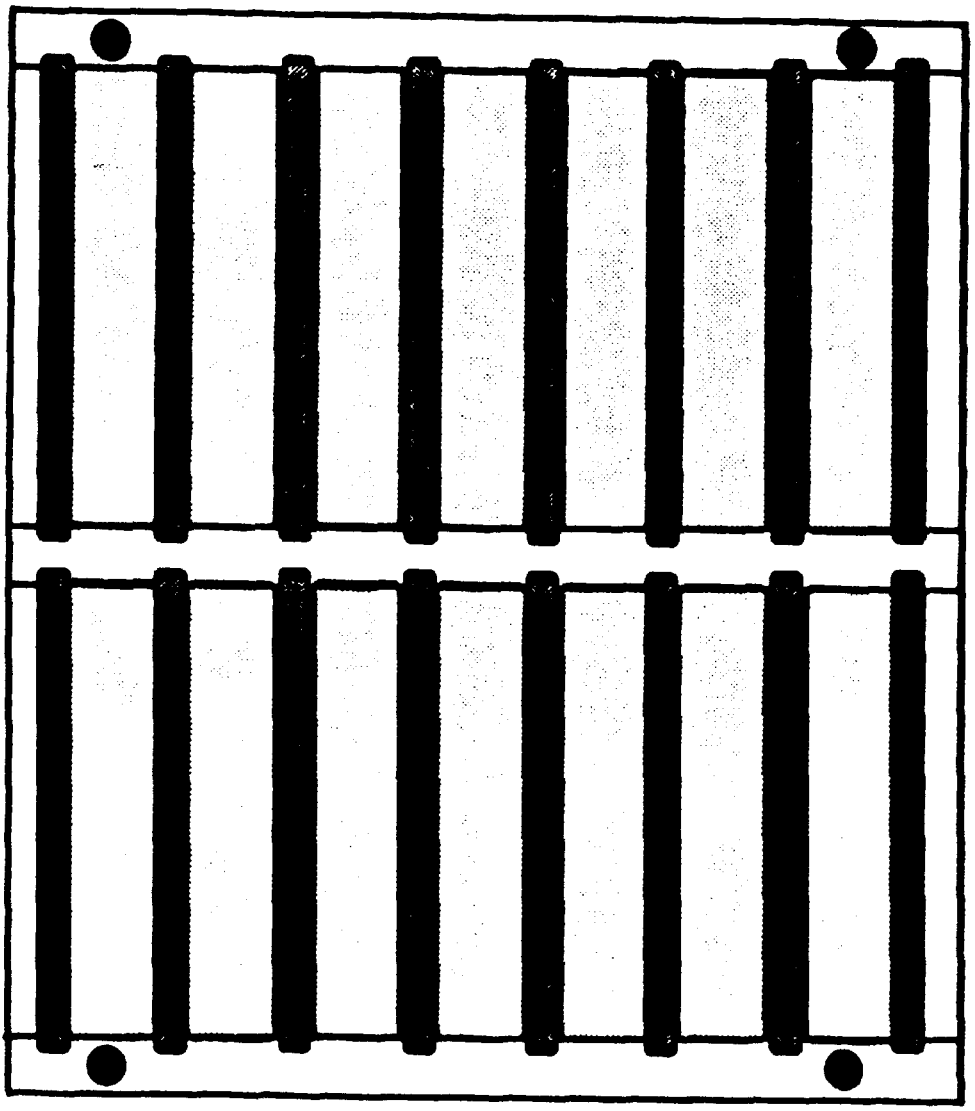
FIG. 33 illustrates a composite substrate panel like that shown in FIG. 32 including slots separating the composite substrate.

Various methods may be used to mass produce the thin multichip modules of the present invention. Referring now to FIG. 31, a flowchart diagram illustrating a general method for assembling thin multichip modules according to one embodiment of the present invention is shown. In step 202 the composite substrate is assembled on a panel as shown in FIG. 32 or 33. FIG. 33 illustrates a panel of composite substrates in which portions of the cover plate has been stamped or excised as represented by the darker shaded area. To facilitate automated handling and volume throughput, the subassembly is preferably assembled as a multiple panel array. The panel array size is optimized for the capability of the processing equipment, and typically ranges from 4×6 inches to 10×15 inches. Tooling reference of alignment holes in the corners of the metal cover plate aid in the proper registration of the thin laminate circuit(s) and adhesive film. The thin metal cover plate in the preferred embodiment comprises stainless steel sheet stock material ranging in thickness from 0.005–0.010 inches. The metal surface can be plated or treated in a variety of finishes.

As previously discussed, the composite substrate is comprised of a heat dissipating cover plate and a thin laminate circuit applied to the cover plate, preferably using a film adhesive. In step 204 the composite substrate is segmented or excised from the panel. In step 206 leads or a flex circuit is attached to the composite substrate edges as required by the particular design or the particular embodiment. In step 208 the active semiconductor devices and passive components are connected mechanically and electrically to the composite substrate. In step 210 the substrate subassembly is tested for functionality. In step 212 an protective epoxy material is overmolded or applied to the underside of the mounted devices. In step 214 the subassemblies are segmented from the panel array if they have not already been segmented in step 204. It is noted that in different embodiments it may be desired that the composite substrate be separated or segmented from the panel in step 204 prior to attaching the semiconductor devices. In other embodiments it may be more desirable to segment the subassembly from the panel array in step 214 after the semiconductor devices and overcoat have been applied. In step 216 the subassemblies are folded if the respective embodiment requires the subassemblies to be folded. It is noted that certain embodiments do not require the subassemblies to be folded. In step 218 the subassembly is assembled onto the module frame. It is noted that in embodiments similar to that shown in FIG. 1, the subassembly is attached to the module frame, thereby forming the semiconductor module. In other embodiments such as those in FIGS. 21 et seq., the subassembly is completed without a frame as part of the module and the subassembly is attached to a module socket which in essence acts as the frame of the module.

Another method comprises the steps of:

forming a cover plate panel, such as that shown in FIG. 30;

forming an array of thin laminate circuits;

affixing the array of thin laminate circuits to the cover plate panel;

removing individual composite substrates from the array of composite substrates; and attaching a plurality of semiconductor devices to each of said individual composite substrates.

A method of forming a plurality of composite substrate subassemblies comprising the steps of:

forming an array of thin laminate circuits;

forming a cover plate panel;

punching out portions of said cover plate panel to form an array of cover plates; and fixing the array of laminate circuits to the array of cover plates.

CONCLUSION

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. An apparatus for attaching semiconductor devices to a circuit board, comprising:

a connector frame socket fixedly attached to the circuit board and including first and second apertures for receiving a semiconductor module, wherein said connector frame socket includes a center contact portion and first and second ends extending beyond said center contact portion;

a semiconductor module adapted to be removably attached to the connector frame socket, wherein the semiconductor module comprises:

a generally U-shaped composite substrate having first and second members;

a first plurality of semiconductor devices connected to said first member of said composite substrate;

a second plurality of semiconductor devices connected to said second member of said composite substrate; and means associated with the distal ends of said members operable to electrically connect said first and second members to said first and second apertures, respectively; and a protective overcoat applied to said first and second members and said first and second pluralities of semiconductor devices.

* * * * *